(12) United States Patent
Jacob et al.

(10) Patent No.: US 10,726,896 B1
(45) Date of Patent: Jul. 28, 2020

(54) RESISTIVE NONVOLATILE MEMORY STRUCTURE EMPLOYING A STATISTICAL SENSING SCHEME AND METHOD

(71) Applicant: GLOBALFOUNDRIES INC., Grand Cayman (KY)

(72) Inventors: Ajey Poovannummoottil Jacob, Watervliet, NY (US); Amogh Agrawal, West Lafayette, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/261,617

(22) Filed: Jan. 30, 2019

(51) Int. Cl.
  *G11C 11/00* (2006.01)
  *G11C 11/16* (2006.01)
  *G11C 13/00* (2006.01)

(52) U.S. Cl.
  CPC ...... *G11C 11/1673* (2013.01); *G11C 11/1659* (2013.01); *G11C 13/004* (2013.01); *G11C 13/0004* (2013.01); *G11C 11/1655* (2013.01); *G11C 11/1657* (2013.01); *G11C 2213/79* (2013.01)

(58) Field of Classification Search
  CPC ............ G11C 11/1673; G11C 13/0004; G11C 13/004; G11C 11/1659; G11C 11/1655; G11C 11/1657; G11C 2213/79
  USPC ........................................................ 365/148
  See application file for complete search history.

(56) References Cited

U.S. PATENT DOCUMENTS

| | | | | |
|---|---|---|---|---|
| 6,795,340 | B2 * | 9/2004 | Sakimura | G11C 11/15 365/158 |
| 7,995,378 | B2 * | 8/2011 | Yoon | G11C 11/1659 365/148 |
| 8,233,309 | B2 * | 7/2012 | Fasoli | G11C 13/0004 365/148 |
| 9,472,256 | B1 | 10/2016 | Andre | |
| 9,653,137 | B2 | 5/2017 | Lee et al. | |
| 9,786,343 | B1 | 10/2017 | DeBrosse | |

(Continued)

OTHER PUBLICATIONS

Jain et al., "Computing in Memory with Spin-Transfer Torque Magnetic RAM," IEEE Transactions on Very Large Scale Integration (VLSI) Systems, vol. 26, Issue 3, 2018, pp. 1-14.

(Continued)

*Primary Examiner* — Tha-O H Bui
(74) *Attorney, Agent, or Firm* — Gibb & Riley, LLC; Michael J. LeStrange, Esq.

(57) ABSTRACT

A memory structure includes a first memory array with two transistor-two variable resistor memory cells and a second memory array with one transistor-one variable resistor memory cells, which are each selectively operable in read, write and standby modes. The first memory array and the second memory array are interleaved so that, when the second memory operates in the read mode, the first memory array automatically and concurrently operates in a reference mode. A method of operating the memory structure includes, when the second memory array operates in the read mode, automatically and concurrently operating the first memory array in the reference mode so that the first memory array generates and outputs a statistical reference voltage, which is between the low and high voltages of a nominal memory cell within the second memory array and which is employed by the second memory array to sense a stored data value.

20 Claims, 13 Drawing Sheets

(56) References Cited

U.S. PATENT DOCUMENTS

| | | |
|---|---|---|
| 9,875,780 B1 | 1/2018 | DeBrosse |
| 10,008,663 B1 | 6/2018 | Hao et al. |
| 2014/0104933 A1* | 4/2014 | Yamahira .............. G11C 7/04 365/148 |
| 2016/0322090 A1 | 11/2016 | Chan et al. |
| 2017/0047106 A1 | 2/2017 | Takaya et al. |
| 2017/0104153 A1 | 4/2017 | Machkaoutsan et al. |
| 2017/0169873 A1 | 6/2017 | Appeltans et al. |

OTHER PUBLICATIONS

Lee et al., "STT-MRAM Read-Circuit with Improved Offset Cancellation," Journal of Semiconductor Technology and Science, vol. 17, No. 3, 2017, pp. 347-353.

Vatajelu et al., "STT MRAM-Based PUFs," Design, Automation & Test in Europe Conference & Exhibition, 2015, pp. 872-875.

* cited by examiner

Distribution of a 9x9 series-parallel network of variable resistors compared to the distribution of a single variable resistor 699(3) for 600(3) of FIG. 5D 699(4) for 600(4) of FIG. 5E

RESISTIVE NONVOLATILE MEMORY STRUCTURE EMPLOYING A STATISTICAL SENSING SCHEME AND METHOD

BACKGROUND

Field of the Invention

The present invention relates to resistive nonvolatile memory (NVM) arrays, such as spin transfer torque-magnetic random access memory (STT-MRAM) arrays or other resistive NVM arrays, and the sensing schemes employed by them during read operations.

Description of Related Art

Resistive nonvolatile memory (NVM) structures are currently being considered by integrated circuit designers as suitable replacements for other on-chip memory arrays because of advantages such as high speed, low power consumption, non-volatility and potentially low area consumption.

A spin transfer torque-magnetic random access memory (STT-MRAM) array is an exemplary resistive NVM array. A STT-MRAM array includes STT-MRAM cells arranged in columns and rows. The simplest STT-MRAM cell includes a single field effect transistor (FET) (e.g., an n-type field effect transistor (NFET)) and a single variable resistor and, particularly, a single magnetic tunnel junction (MTJ). The FET and MTJ are connected in series between a source line and a bit line with the gate of the FET controlled by the state of a word line. A MTJ is a multi-layer structure, which includes a fixed ferromagnetic layer (also referred to as a pinned layer) and a switchable ferromagnetic layer (also referred to as a free layer) separated by a thin dielectric layer (e.g., a thin oxide layer).

Depending upon the biasing conditions employed during a write operation, the MTJ-type variable resistor will exhibit either a low resistance (Rl) or a high resistance (Rh). More specifically, during a write operation, a high voltage (VDD) can be applied to the word line and the bit line. The source line can be connected to ground. In this case, current flows from the bit line toward the source line such that the free layer switches to (or maintains) a parallel state (also referred to as a low resistance state), thereby storing a logic value of "0" in the STT-MRAM cell. Alternatively, VDD can be applied to the word line and the source line and the bit line can be connected to ground. In this case, current flows from the source line toward the bit line such that the free layer switches to (or maintains) the anti-parallel state (also referred to as a high resistance state), thereby storing a logic value "1" in the STT-MRAM cell.

During a read operation, VDD is applied to the word line, a low positive voltage (VREAD) is applied to the bit line and the source line is connected to ground. In this case, the parallel/low resistance state (e.g., a logic "0") will be indicated by a low voltage on the bit line and an anti-parallel/high resistance state (e.g., a logic "1") will be indicated by a high voltage on the bit line. To detect whether there is a low voltage or a high voltage on the bit line, a sense amplifier (SA) is employed to compare the voltage (VDATA) on the bit line to a reference voltage (VREF), which is supplied by a reference cell. The reference cell is designed to generate a VREF that is between the low voltage and the high voltage. However, with current technologies, the range between the low voltage and the high voltage is relatively small and designing a reference cell that can reliably produce a VREF between the low voltage and the high voltage can be challenging particularly given inherent process and thermal variations.

More complex STT-MRAM arrays with, for example, more complex STT-MRAM cells (e.g., two transistor-two MTJ memory cells) have been developed to eliminate the requirement for separate reference cell(s) and minimize read errors. However, the increased complexity and larger STT-MRAM cell size in such arrays result in a significantly larger amount of chip area consumed.

Other resistive NVM arrays, which similarly include memory cells with variable resistors that can be programmed during a write operation to exhibit either a low resistance or a high resistance and which similarly suffer from sensing challenges, are also known in the art. These other resistive NVM arrays include, for example, phase change random access memory (PCRAM) arrays and resistive random access memory (RRAM) arrays.

SUMMARY

In view of the foregoing, disclosed herein are embodiments of a resistive non-volatile memory (NVM) structure with multiple resistive NVM memory arrays including a first memory array with two transistor-two variable resistor memory cells and a second memory array with one transistor-one variable resistor memory cells. Each of the resistive NVM memory arrays can be selectively operable in read, write and standby modes. Additionally, the first memory array and the second memory array can be interleaved so that, when the second memory operates in the read mode, the first memory array automatically and concurrently operates in a reference mode. Specifically, when the second memory array operates in the read mode, the first memory array can generate and output a reference voltage and, particularly, a statistical reference voltage, which is between the low and high voltages of a nominal memory cell within the second memory array and which is employed by the second memory array to sense a stored data value in a selected second memory cell. By using one transistor-one variable resistor memory cells in the second memory array, the amount of area consumed by the resistive NVM structure is reduced. Furthermore, by using the first memory array to provide a statistical reference voltage for second memory array read operations, the requirement for additional reference cell(s) is avoided and read errors associated with sensing stored data values in the one transistor-one variable resistor second memory cells are minimized. Also disclosed herein are embodiments of a corresponding sensing method.

More particularly, disclosed herein are embodiments of a nonvolatile memory (NVM) structure. Each of the embodiments of the NVM structure can include at least two resistive NVM arrays including a first memory array and a second memory array. The first memory array can include first memory cells arranged in columns and rows and each first memory cell can be a two transistor-two variable resistor memory cell. The second memory array can include second memory cells arranged in columns and rows and each second memory cell can be a one transistor-one variable resistor memory cell. For example, the first memory array can be a spin transfer torque-magnetic random access memory (STT-MRAM) array and each first memory cell can be a two transistor-two magnetic tunnel junction (MTJ) memory cell. In this case, the second memory array can be another STT-MRAM array, but each second memory cell can be a one transistor-one MTJ memory cell.

In any case, the first memory array and the second memory array can each be selectively operable in read, write and standby modes. Additionally, the first memory array and the second memory array can be interleaved such that, when the second memory array operates in the read mode, the first memory array automatically and concurrently operates in a reference mode. When operating in the reference mode, the first memory array generates and outputs a reference voltage that is received and employed by the second memory array to sense a data value stored in a selected second memory cell.

To accomplish this, the first memory array can include a plurality of switch interconnects that are controlled by a reference mode signal. In the standby, read or write modes, the reference mode signal can be maintained at a first level such that the switch interconnects are turned off. Operation of the first memory array in the reference mode can be triggered by switching the reference mode signal from the first level to a second level. When the reference mode signal is at the second level, the switch interconnects turn on, thereby causing at least some of the first memory cells in the first memory array to be electrically connected in a series-parallel resistor network that generates the reference voltage and further causing the series-parallel resistor network to be electrically connected to a sense circuit in the second memory array.

As discussed in greater detail in the detailed description section below, in some exemplary embodiments disclosed herein, due to the placement of the switch interconnects within the first memory array, the reference voltage that is generated by the series-parallel resistor network is data-dependent (i.e., dependent upon the data values stored in the first memory cells within the series-parallel resistor network). In other exemplary embodiments disclosed herein, due to the placement of the switch interconnects within the first memory array, the reference voltage that is generated by the series-parallel resistor network is data-independent (i.e., not dependent upon the data values stored in the first memory cells within the series-parallel resistor network) and constant.

Also disclosed herein are embodiments of a sensing method that can be employed within a resistive nonvolatile memory (NVM) structure, as described above, that includes at least two resistive NVM arrays. Specifically, the resistive NVM structure can include a first memory array and a second memory array. The first memory array can include first memory cells arranged in columns and rows and each first memory cell can be a two transistor-two variable resistor memory cell. The second memory array can include second memory cells arranged in columns and rows and each second memory cell can be a one transistor-one variable resistor memory cell. For example, the first memory array can be a spin transfer torque-magnetic random access memory (STT-MRAM) array and each first memory cell can be a two transistor-two magnetic tunnel junction (MTJ) memory cell. In this case, the second memory array can be another STT-MRAM array, but each second memory cell can be a one transistor-one MTJ memory cell.

The method can include selectively operating the first memory array in read, write and standby modes and also selectively operating the second memory array in read, write and standby modes. Additionally, the method can include concurrently operating the first memory array in a reference mode, when the second memory array is operating in the read mode. Operating the first memory array in the reference mode can include generating and outputting a reference voltage. Concurrently operating the second memory array in the read mode can include receiving the reference voltage from the first memory array and employing the reference voltage to sense a data value stored in a selected second memory cell within the second memory array.

To accomplish concurrent operation of the first memory array in the reference mode and the second memory array in the read mode, the method can further include triggering operation of the first memory array in the reference mode by automatically switching a reference mode signal from a first level to a second level when the second memory array switches to the read mode. The reference mode signal can control a plurality of switch interconnects within the first memory array and, when the reference mode signal switches to the second level, the switch interconnects can turn on, thereby causing at least some of the first memory cells in the first memory array to be electrically connected in a series-parallel resistor network that generates the reference voltage and further causing the series-parallel resistor network to be electrically connected to a sense circuit in the second memory array.

As mentioned above and discussed in greater detail in the detailed description section below, in some exemplary embodiments disclosed herein, due to the placement of the switch interconnects within the first memory array, the reference voltage that is generated by the series-parallel resistor network is data-dependent (i.e., dependent upon the data values stored in the first memory cells within the series-parallel resistor network). In other exemplary embodiments disclosed herein, due to the placement of the switch interconnects within the first memory array, the reference voltage that is generated by the series-parallel resistor network is data-independent (i.e., not dependent upon the data values stored in the first memory cells within the series-parallel resistor network) and constant.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, resistive nonvolatile memory (NVM) structures are currently being considered by integrated circuit designers as suitable replacements for other on-chip memory arrays because of advantages such as high speed, low power consumption, non-volatility and potentially low area consumption.

Figure 1:
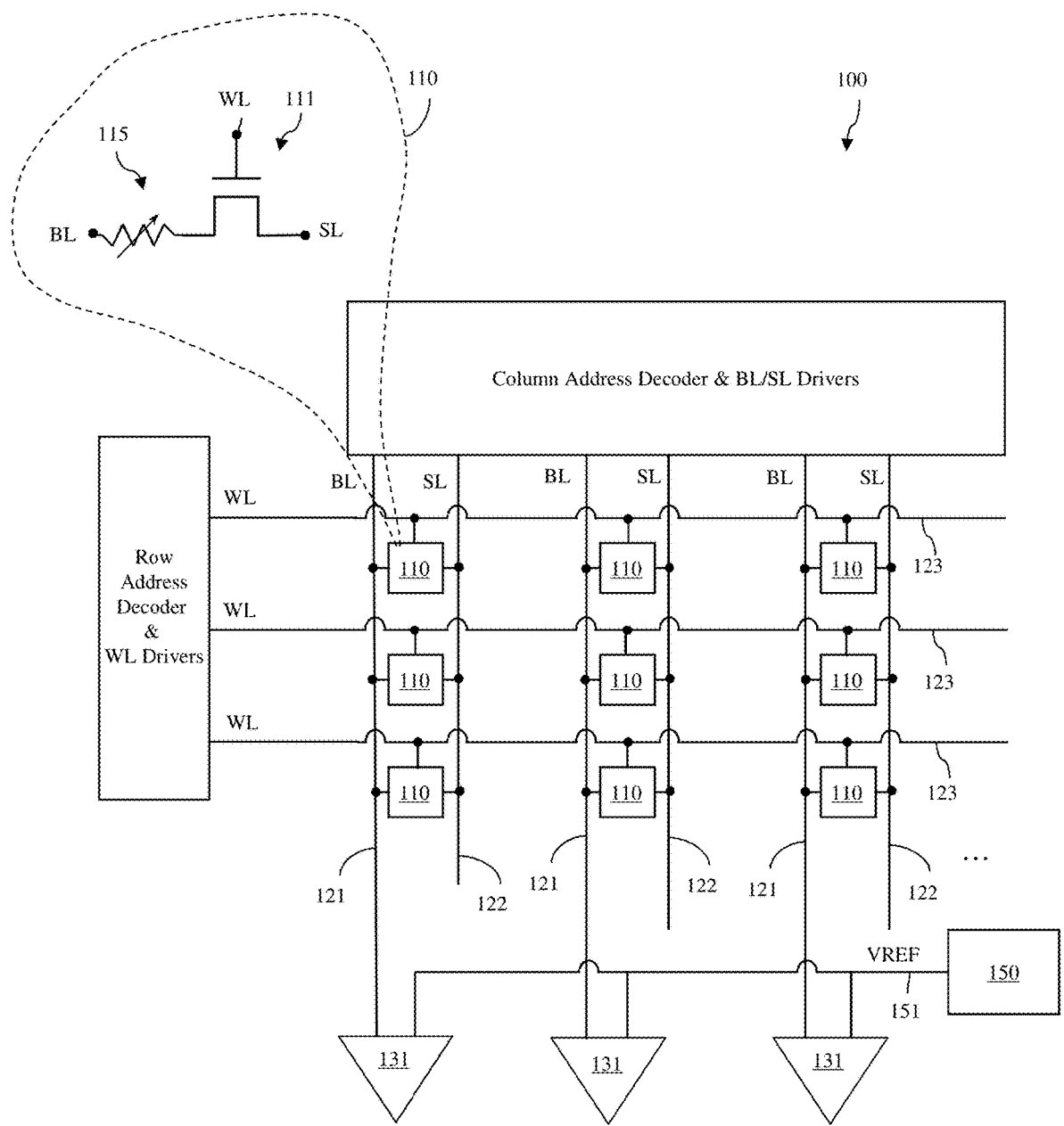
FIG. 1 is a schematic diagram illustrating a resistive nonvolatile memory (NVM) array that includes one transistor-one variable resistor (1T-1R) memory cells.

FIG. 1 is a schematic diagram illustrating an exemplary resistive NVM array 100 with memory cells 110 arranged in columns and rows. Each memory cell 110 can be a one transistor-one variable resistor (1T-1R) memory cell connected in series between a source line 122 and a bit line 121. The variable resistor can be configured to selectively exhibit either a low resistance (Rl) or a high resistance (Rh), depending upon the biasing conditions employed during a write operation. For example, the resistive NVM array 100 can be a spin transfer torque-magnetic random access memory (STT-MRAM) array and each STT-MRAM cell can include a single field effect transistor (e.g., an n-type field effect transistor (NFET)) 111 and a single magnetic tunnel junction (MTJ) 115 (which functions as a variable resistor) connected in series between the source line 122 and the bit line 121. As illustrated, all memory cells 110 in the same column are connected to the same source line 122 and the same bit line 121. Furthermore, all memory cells 110 in the same row have transistor gates controlled by the same word line 123.

Figure 2A:
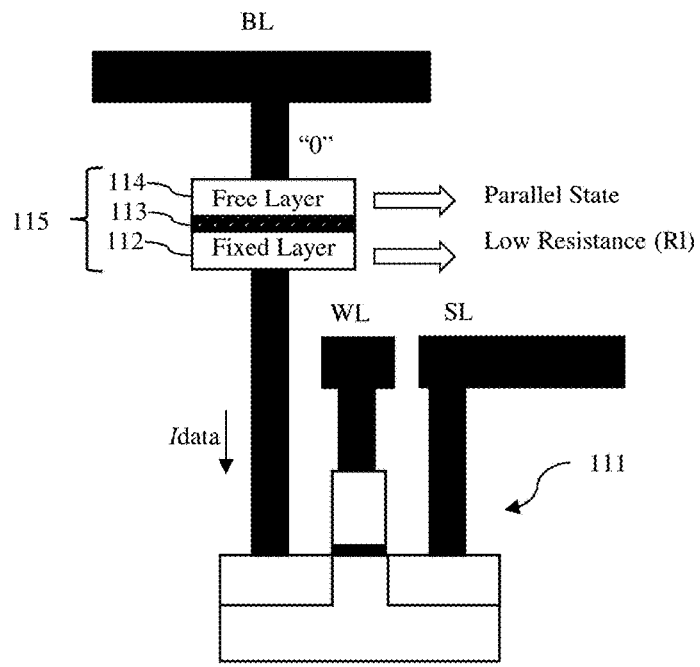
FIGS. 2A and 2B are cross-section diagrams illustrating an exemplary spin transfer torque-magnetic random access memory (STT-MRAM) cell with a magnetic tunnel junction (MTJ) in a parallel/low resistance state and an anti-parallel/high resistance state, respectively.
Figure 2B:
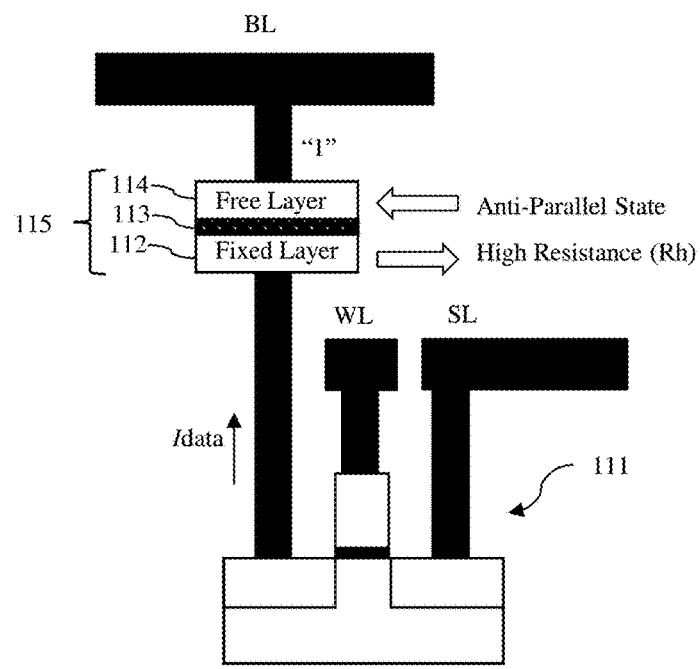

FIG. 2A and FIG. 2B further illustrate an exemplary STT-MRAM cell 110 with the MTJ 115 in a parallel/low resistance state and in an anti-parallel/high resistance state, respectively. More particularly, referring to FIG. 1 in combination with FIGS. 2A-2B, the MTJ 115 is a multi-layer structure that includes a fixed ferromagnetic layer 112 (also referred to as a pinned layer) and a switchable ferromagnetic layer 114 (also referred to as a free layer) separated by a thin dielectric layer 113 (e.g., an thin oxide layer). During a standby mode, the word line, bit line and source line are each connected to ground. During a write operation, depending upon the biasing conditions employed, the MJT can exhibit either a low resistance or a high resistance. Specifically, during a write operation, a high positive voltage (VDD) can be applied to the word line and the bit line and the source line can be connected to ground. In this case, current flows from the bit line toward the source line such that the free layer switches to (or maintains) the parallel state (also referred to as a low resistance state), thereby storing a logic value of "0" in the STT-MRAM cell (as shown in FIG. 2A). Alternatively, VDD can be applied to the word line and the source line and the bit line can be connected to ground. In this case, current flows from the source line toward the bit line such that the free layer switches to (or maintains) the anti-parallel state (also referred to as a high resistance state), thereby storing a logic value "1" in the STT-MRAM cell (as shown in FIG. 2B). During a read operation, VDD is applied to the word line, a relatively low read voltage (VREAD) is applied to the bit line and the source line is connected to ground. In this case, a parallel/low resistance state (e.g., a logic "0") will be indicated by a low voltage on the bit line and an anti-parallel/high resistance state (e.g., a logic "1") will be indicated by a high voltage on the bit line. To detect whether there is a low voltage or a high voltage on the bit line, a sense amplifier (SA) 131 for each column is employed to compare the voltage (VDATA) on the bit line to a reference voltage (VREF) 151 supplied by a reference cell 150, which is designed to generate a VREF 151 that is between the low voltage and the high voltage. However, with current technologies, the range between the low voltage and the high voltage is relatively small and designing a reference cell that can reliably produce a VREF between the low voltage and the high voltage can be challenging, particularly, given inherent process and thermal variations.

More complex resistive NVM arrays with more complex memory cells have been developed to eliminate the requirement for separate reference cell(s) and to minimize read errors.

Figure 3:
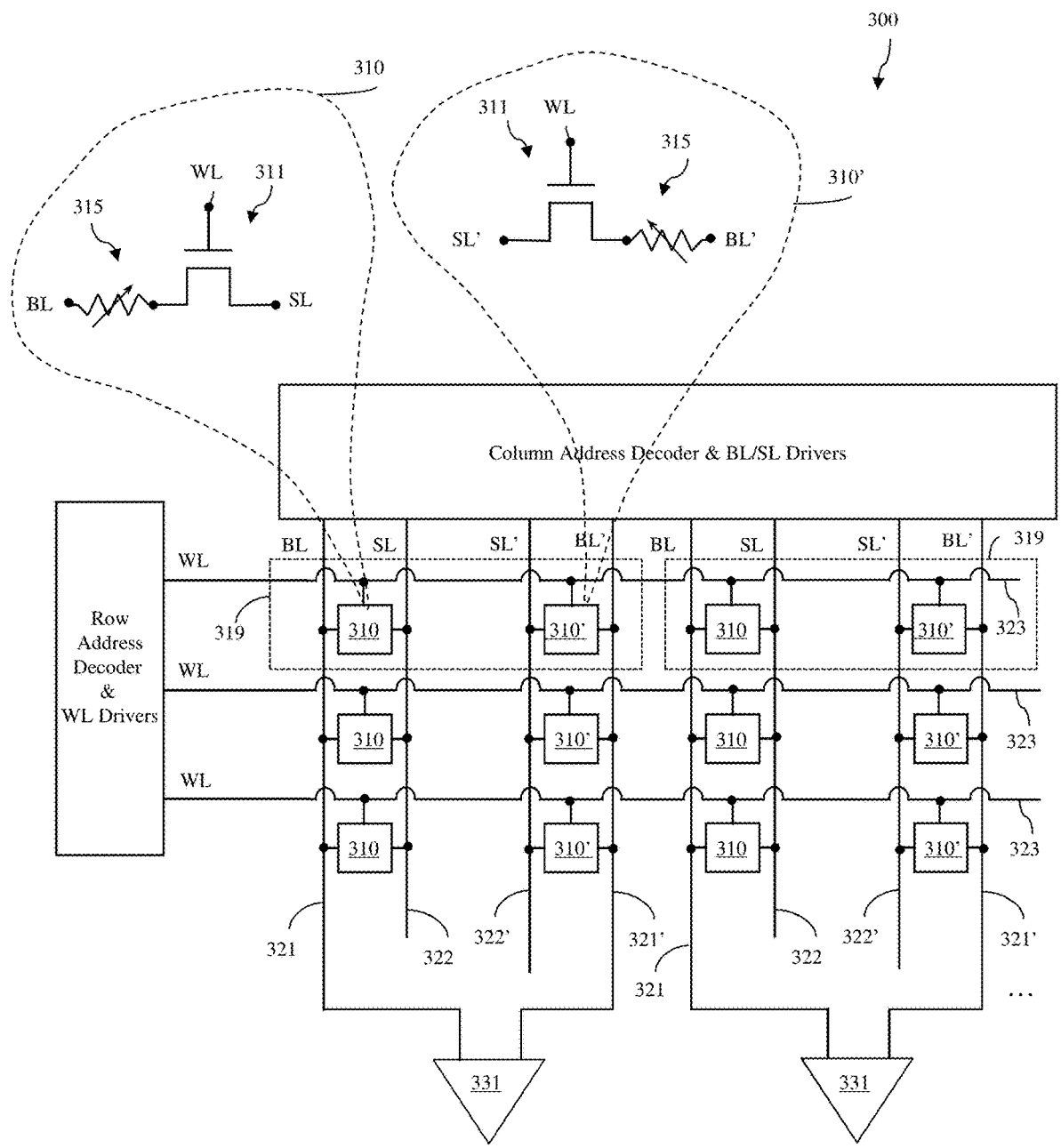
FIG. 3 is a schematic diagram illustrating a resistive NVM array that includes two transistor-two variable resistor (2T-2R) memory cells.

FIG. 3 is a schematic diagram illustrating an exemplary resistive NVM array 300 with more complex memory cells 319 arranged in columns and rows. Each memory cell 319 includes two transistors (e.g., NFETs) 311 and two variable resistors 315. For example, the resistive NVM array 300 can be a STT-MRAM array and each memory cell 319 within the array can be a STT-MRAM cell, which includes one NFET-MTJ device 310 connected in series between a source line 322 and a bit line 321 and an additional NFET-MTJ device 310' connected in series between an additional source line 322' and an additional bit line 321'. As illustrated, all memory cells 319 in the same column are connected to the same bit line 321, additional bit line 321', source line 322 and additional source line 322'. Furthermore, all memory cells 319 in the same row can have transistor gates controlled by the same word line 323. During a write operation for a selected memory cell 319, the two devices 310 and 310' are written to opposite logic values. During a read operation for a selected memory cell 319, the voltage (VDATA) on the bit line 321 for the column is compared by a sense amplifier 331 to the voltage on the additional bit line 321' of the same column, which functions as the reference voltage (VREF). The increased complexity and larger memory cell size in such an array result in a significantly larger amount of chip area consumed.

Figure 4:
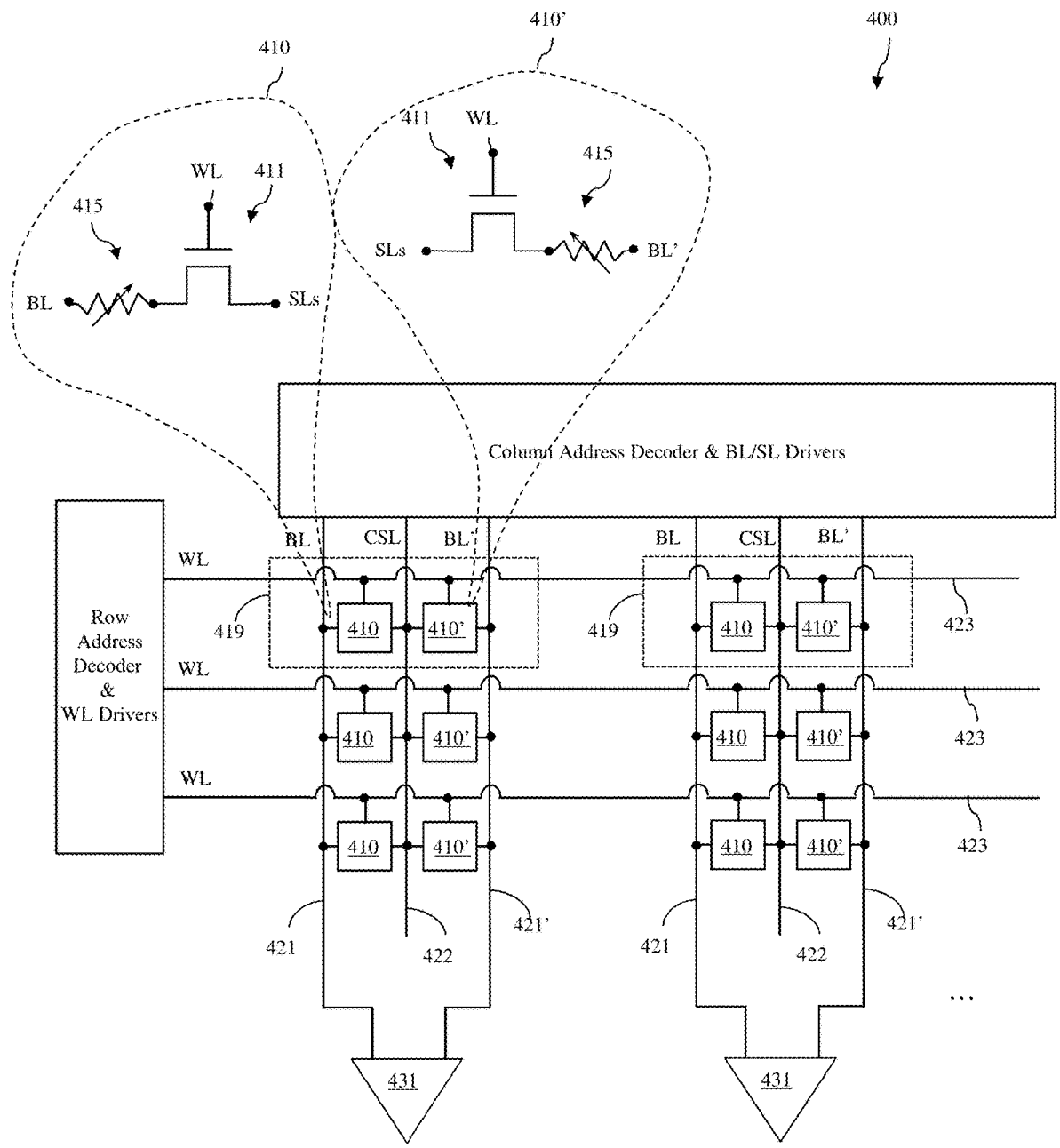
FIG. 4 is a schematic diagram illustrating another resistive NVM array that includes 2T-2R memory cells.

FIG. 4 is a schematic diagram illustrating another exemplary resistive NVM array 400 with more complex memory cells 419 arranged in columns and rows. Each memory cell 419 also includes two transistors (e.g., NFETs) 411 and two variable resistors 415. For example, the resistive NVM array 400 can be a STT-MRAM array and each memory cell 419 within the array can be a STT-MRAM cell, which similarly includes two NFET-MTJ devices 410, 410'. However, in this case, to reduce the area consumed by the memory array, a common source line 422 is used for the NFET-MTJ devices 410, 410' in each column. That is, each STT-MRAM cell 419 includes one NFET-MTJ device 410 connected in series between a common source line 422 and a bit line 421 and an additional NFET-MTJ device 410' connected in series between the common source line 422 and an additional bit line 421'. As illustrated, all memory cells 419 in the same column are connected to the same bit line 421, additional bit line 421', and common source line 422. Furthermore, all memory cells 419 in the same row can have transistor gates controlled by the same word line 423. While this configuration reduces area consumption, more complex biasing schemes must be applied during write operations because of the common source line 422. For example, one technique that can be used during write operations employs a dual supply voltage (e.g., +VDD and −VDD). In this technique, the common source line 422 is grounded, while the bit line 421 and the additional bit line 421' are biased at +VDD and −VDD, respectively, to write a "0" and vice-versa to write a "1". Alternatively, the common source line 422 can be left floating and the bit line 421 and the additional bit line 421' can be biased to 2VDD and 0, respectively, to write a "0" and vice versa to write a "1". Alternatively, a multi-step write process can be employed. The bit line 421 and the additional bit line 421' can be biased to VDD and 0, respectively, to write a "0" and vice-versa to write a "1". In the first step, the common source line 422 can be biased at 0, thereby writing into one of the variable resistors. In the second step, CSL is pulled to VDD, thereby writing into the other variable resistor. During a read operation, the common source line 422 can be grounded, and a read current (TREAD) can be passed through the bit line 421 and the additional bit line 421'. Thus, a voltage difference between the bit line 421 and the additional bit line 421' is developed, which is the same as the previous embodiment, and is sensed using a sense amplifier 431. Still the increased complexity and larger STT-MRAM cell size in such an array result in a significantly larger amount of chip area consumed.

Another example of a resistive NVM array, which includes memory cells with variable resistors that can be appropriately biased (i.e., programmed) during a write operation to exhibit either a low resistance or a high resistance and which suffers from similar sensing challenges, is a phase change random access memory (PCRAM) array. In a PCRAM array, PCRAM cells are arranged in columns and rows. The simplest PCRAM cell includes a single field effect transistor (FET) and a single variable resistor and, particularly, a single phase change material layer (e.g., a chalcogenide glass) that exhibits a different resistance depending upon its crystalline state. In this case, the crystalline/low resistance state (e.g., a logic "0") will be indicated by a low voltage on the bit line and the amorphous/high resistance state (e.g., a logic "1") will be indicated by a high voltage on the bit line. To detect whether there is a low voltage or a high voltage on the bit line, a sense amplifier (SA) is employed to compare the voltage (VDATA) on the bit line to a reference voltage (VREF) supplied by a reference cell, which is designed to generate a VREF that is between the low voltage and the high voltage. However, like with the STT-MRAM array discussed above, the range between the low voltage and the high voltage is relatively small and designing a reference cell that can reliably produce a VREF between the low voltage and the high voltage can be challenging, particularly, given inherent process and thermal variations in the phase change material layers.

Yet another example of a resistive NVM array, which includes memory cells with variable resistors that can be appropriately biased (i.e., programmed) during a write operation to exhibit either a low resistance or a high resistance and which suffers from similar sensing challenges, is a resistive random access memory (RRAM or ReRAM). In a RRAM array, RRAM cells are arranged in columns and rows. The simplest RRAM cell includes a single field effect transistor (FET) and a single variable resistor and, particularly, a single memristor device (e.g., a dielectric solid-state material, such as a thin oxide layer) that exhibits different resistances depending upon migration of defects (e.g., oxygen vacancies or metal defects) within the memristor material. Specifically, different biasing conditions can cause migration of defects in a manner that either breaks or reforms a filament (i.e., a conduction path) within the memristor. The filament/low resistance state (e.g., a logic "0") will be indicated by a low voltage on the bit line and the broken filament/high resistance state (e.g., a logic "1") will be indicated by a high voltage on the bit line. To detect whether there is a low voltage or a high voltage on the bit line, a sense amplifier (SA) is employed to compare the voltage (VDATA) on the bit line to a reference voltage (VREF) supplied by a reference cell, which is designed to generate a VREF that is between the low voltage and the high voltage. However, like with the other types of resistive NVM arrays discussed above, the range between the low voltage and the high voltage is relatively small and designing a reference cell that can reliably produce a VREF between the low voltage and the high voltage can be challenging, particularly, given inherent process and thermal variations of the memristors.

Oftentimes resistive NVM structures, such as those described above, require multiple resistive NVM arrays (e.g., on a single chip and/or on different chips within a multi-chip package) and in this case area consumption by the memory arrays is of particular concern to designers. In view of the foregoing, disclosed herein are embodiments of a resistive non-volatile memory (NVM) structure with multiple resistive NVM arrays including a first memory array with two transistor-two variable resistor memory cells and a second memory array with one transistor-one variable resistor memory cells. Each of these resistive NVM arrays can be selectively operable in read, write and standby modes. Additionally, the first memory array and the second memory array can further be interleaved so that, when the second memory operates in the read mode, the first memory array automatically and concurrently operates in a reference mode. Specifically, when the second memory array operates in the read mode, the first memory array generates and outputs a reference voltage and, particularly, a statistical reference voltage, which is between the low and high voltages of a nominal memory cell within the second memory array and which is employed by the second memory array to sense a stored data value in a selected memory cell. By using one transistor-one variable resistor memory cells in the second memory array, the amount of area consumed by the resistive NVM structure is reduced. Furthermore, by using the first memory array to provide a statistical reference voltage for the second memory array, the requirement for additional reference cell(s) is avoided and read errors associated with sensing stored data values in one transistor-one variable resistor second memory cells are minimized. Also disclosed herein are embodiments of a corresponding sensing method.

Figure 5A:
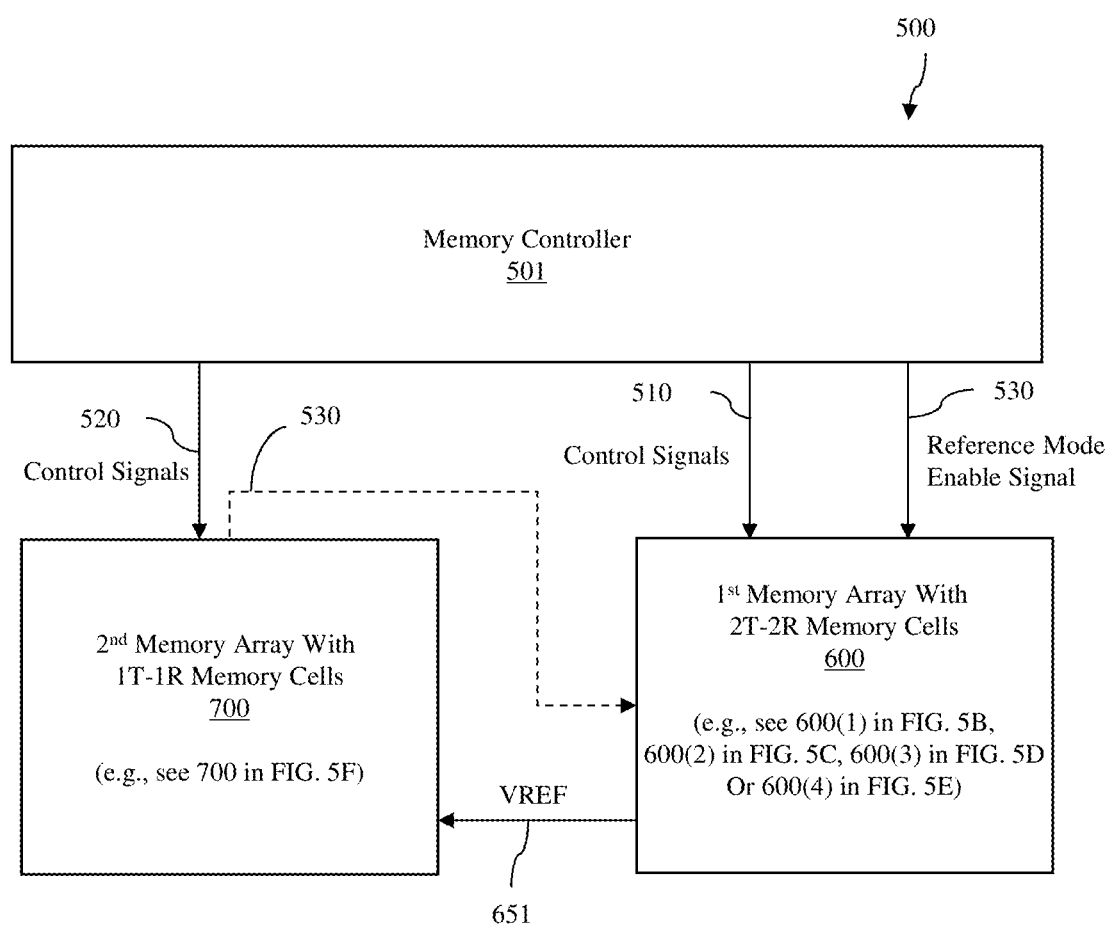
FIG. 5A is a schematic diagram illustrating embodiments of a resistive nonvolatile memory (NVM) structure that incorporates at least two NVM arrays including a first memory array with 2T-2R memory cells and a second memory array with 1T-1R memory cells, where the first memory array and the second memory array are interleaved.

More particularly, referring to FIG. 5A, disclosed herein are embodiments of a resistive nonvolatile memory (NVM) structure 500. Each of the embodiments of the resistive NVM structure 500 can include at least two resistive NVM arrays on either the same integrated circuit (IC) chip or on different IC chips within the same multi-chip package. These resistive NVM arrays can include at least a first memory array 600, which includes first memory cells and, particularly, two transistor-two variable resistor (2T-2R) memory cells, and a second memory array 700, which includes second memory cells and, particularly, one transistor-one variable resistor (1T-1R) memory cells.

In one exemplary embodiment, the first memory array 600 (including the alternative possible configurations disclosed herein) and the second memory array 700 can be spin transfer torque-magnetic random access memory (STT-MRAM) arrays, where the two variable resistors in each first memory cell of the first memory array 600 and the one variable resistor in each second memory cell of the second memory array 700 are all magnetic tunnel junctions (MTJs).

In other exemplary embodiments, other types of resistive NVM arrays with other types of variable resistors can be employed. For example, the resistive NVM arrays 600, 700 can be phase change random access memory (PCRAM) arrays, where the two variable resistors of each first memory cell in the first memory array 600 and the one variable resistor of each second memory cell in the second memory array 700 are phase change material layers. Alternatively, the resistive NVM arrays 600, 700 can be resistive random access memory (RRAM or ReRAM) arrays, where the two variable resistors of each first memory cell in the first memory array 600 and the one variable resistor of each second memory cell in the second memory array 700 are memristors. Alternatively, the resistive NVM arrays 600, 700 can be any other suitable type of resistive NVM arrays where variable resistor(s) in the memory cells can be appropriately biased (i.e., programmed) during a write operation to exhibit either a low resistance (e.g., for storage of a "0" bit) or a high resistance (e.g., for storage of a "1" bit).

FIGS. 5B-5E are schematic diagrams illustrating alternative first memory array configurations 600(1)-600(4) that can be incorporated into the resistive NVM structure 500. FIG. 5F is a schematic diagram illustrating an exemplary second memory array configuration 700 that can be incorporated into the resistive NVM structure 500.

As illustrated, the first memory array 600 (e.g., regardless of whether the configuration used is that shown in FIG. 5B, FIG. 5C, FIG. 5D or FIG. 5E) can include first memory cells 619 arranged in columns and rows. Each first memory cell 619 within the first memory array 600 can be a 2T-2R memory cell. Each first memory cell 619 can include a pair of transistor-variable resistor devices 610, 610', each device 610, 610' including a field effect transistor (e.g., an n-type field effect transistor (NFET)) 611 and a variable resistor 615. The second memory array 700 (see FIG. 5F) can include second memory cells 710 arranged in columns and rows. Each second memory cell 710 can be a 1T-1R memory cell. That is, each second memory cell 710 can include a single transistor-variable resistor device, including a field effect transistor (e.g., an NFET) 711 and a variable resistor 715.

Each transistor-variable resistor device 610, 610' within the first memory cells 619 and the transistor-variable resistor device within the second memory cells 710 can have, for example, the same basic structure. The type of variable resistors used in the first memory cells and the second memory cells will vary depending upon the type of resistive NVM array. For example, the variable resistors of STT-MRAM cells used in STT-MRAM arrays will be magnetic tunnel junctions (MTJs), which, as described above and shown in FIGS. 2A and 2B, can include a free layer that can be selectively programmed into either a parallel/low resistance state (Rl) or an anti-parallel/high resistance (Rh), depending upon the biasing conditions used during a write operation. The variable resistors of the PCRAM cells used in PCRAM arrays will be phase change material layers, which as described above can be selectively programmed into either a crystalline/low resistance state (Rl) or an amorphous/high resistance state (Rh), depending upon the biasing conditions used during a write operation. The variable resistors of the RRAM cells used in RRAM arrays will be memristors, which as described above can be selectively programmed into either a filament/low resistance state (Rl) or a broken filament/high resistance state (Rh) depending upon the biasing conditions used during a write operation.

In any case, the first memory array 600 and the second memory array 700 can each be selectively operable in read, write and standby modes. For example, the NVM structure 500 can include a memory controller 501 (e.g., a computer processing unit (CPU)) that is operably connected to the first memory array 600 and the second memory array 700. This memory controller 501 can provide first control signals 510 and second control signals 520 to the first memory array 600 and the second memory array 700, respectively, for separately and selectively controlling operations performed by those arrays. Such control signals can include, for example, address signals (e.g., row and column address signals) as well as read, write or standby signals. Peripheral circuitry in each of the memory arrays 600, 700 facilitates writing data values to and reading data values from the memory cells 619, 710 based on these control signals. This peripheral circuitry includes, but is not limited to, column address decode logic, bit line and source line drivers, row address decode logic, word line drivers and a sense circuit 630, 730. The sense circuit 630, 730 in each memory array includes sense amplifiers 631, 731 for each column and each sense amplifier can be configured to sense a stored data value in a selected memory cell in the column during a read operation.

It should be noted that, as mentioned above with regard to memory arrays 100, 300, 400 shown in FIGS. 1, 3 and 4, respectively, and as further discussed in greater detail below, for the first memory array 600 where the first memory cells 619 are two transistor-two variable resistor memory cells, each sense amplifier 631 will compare voltages on two bit lines during a read operation, whereas for the second memory array 700 where the second memory cells 710 are one transistor-one variable resistor memory cells, each sense amplifier 731 will compare a voltage (VDATA) on a bit line to a reference voltage (VREF) during a read operation. In any case, the above-mentioned peripheral circuitry is well known in the art and, thus, the details thereof have been omitted from this specification in order to allow the reader to focus on the salient aspects of the disclosed embodiments.

Additionally, the first memory array 600 and the second memory array 700 can be interleaved such that, whenever the second memory array 700 operates in the read mode, the first memory array 600 automatically and concurrently operates in a reference mode. When operating in the reference mode, the first memory array 600 can generate and output a reference voltage (VREF) 651 at a node A. When operating in the read mode, the second memory array 700 can receive the reference voltage (VREF) 651 and a sense circuit 730 of the second memory array 700 can employ the reference voltage (VREF) 651 to sense a data value stored in a selected second memory cell.

To accomplish this, the first memory array 600 can include a plurality of switch interconnects. Placement of these switch interconnects within the first memory array 600 can vary, for example, as indicated in the different embodiments disclosed herein (see the detailed discussion below of the different first memory arrays 600(1)-600(4) of FIGS. 5B-5E, respectively, which can be incorporated into the resistive NVM structure 500). In any case, these switch interconnects can all be controlled by a reference mode signal 530, which is received by the first memory array 600 from the memory controller 501 or, alternatively, from the second memory array 700, and which switches levels when operation of the second memory array 600 in the read mode is initiated.

Specifically, when the second memory array 700 is operating in any mode other than the read mode (i.e., the write mode or the standby mode), the reference mode signal 530 can be maintained at a first level such that the switch interconnects are all turned off, thereby allowing the first memory array 600 to independently and selectively operate in either the read mode, the write mode or the standby mode. However, when operation of the second memory array 700 switches to the read mode, operation of the first memory array 600 in the reference mode can be automatically triggered by switching of the reference mode signal 530 from the first level to a second level. When the reference mode signal 530 is at the second level, the switch interconnects turn on, thereby causing at least some of the first memory cells 619 in the first memory array 600 to be electrically connected within a series-parallel resistor network and further causing a node A in the series-parallel resistor network to be electrically connected to the sense circuit 730 in the second memory array 700. Additionally, the series-parallel resistor network can be biased according to specific reference mode control signals so that the reference voltage (VREF) 651 is generated at node A.

It should be noted that the switch interconnects can be incorporated into the circuitry of the first memory array 600 without disturbing the first memory array 600 itself such that memory density and memory characteristics are retained during all modes of operation. Furthermore, it should be noted that the low and high resistance states of the variable resistors within the first memory cells 619 in the first memory array 600 and within the second memory cells 710 within the second memory array 700 will vary due to random process and thermal variations. This is true regardless of whether those variable resistors are MTJs, phase change memory layers, memristors, etc.

In each of the exemplary embodiments disclosed herein, the series-parallel resistor network created by turning on the switch interconnects within a first memory array 600 is designed so that the reference voltage (VREF) 651 at node A is a statistical reference voltage that is proportional to an average resistance (or, more specifically, a total effective resistance) across all of the variable resistors of all first memory cells 619 incorporated into the series-parallel resistor network between nodes A and B, thereby averaging out the random variations among them.

Figure 5B:
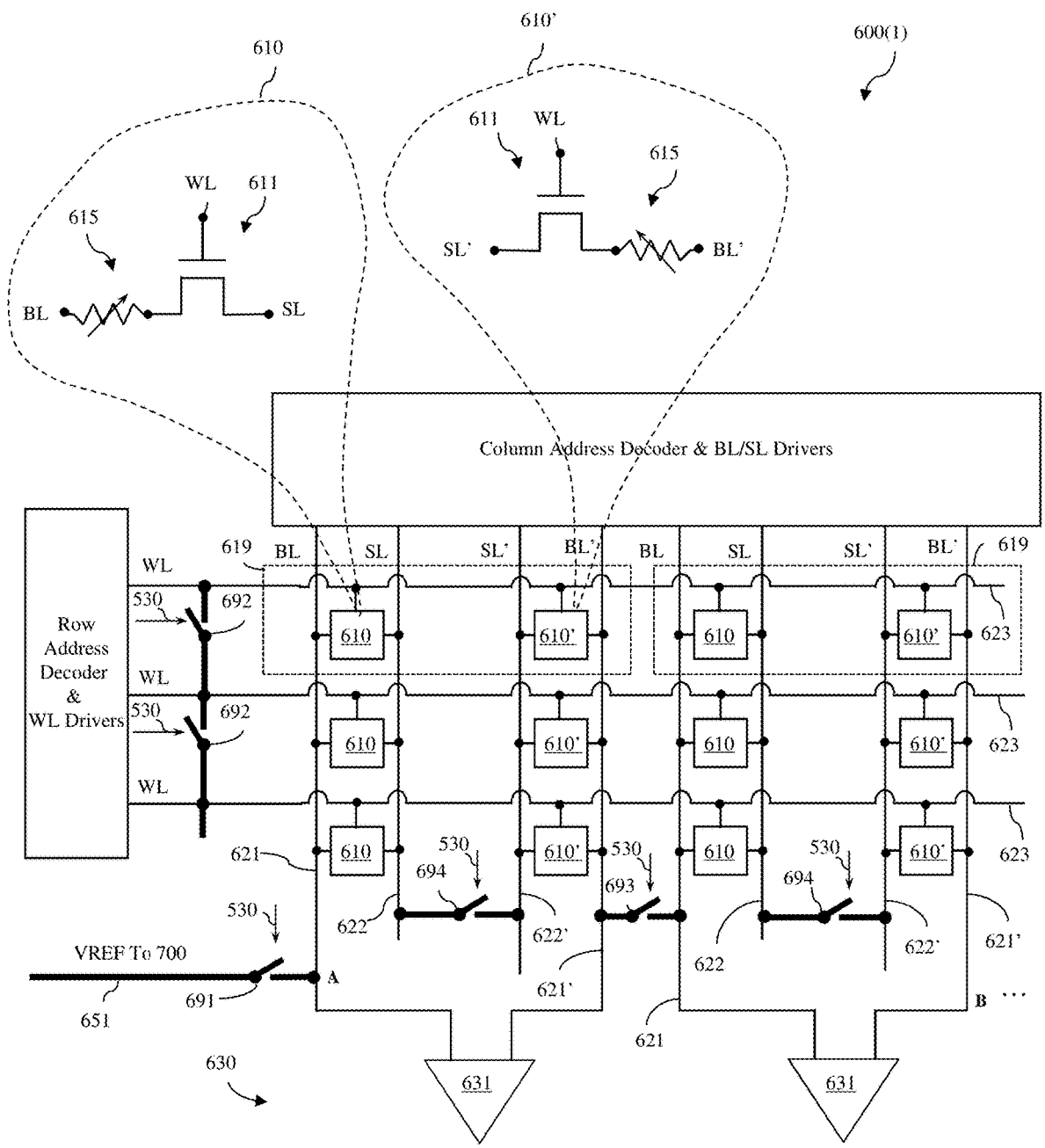
FIGS. 5B-5E are schematic diagrams illustrating exemplary alternative configurations, respectively, for the first memory array of the resistive NVM structure of FIG. 5A.
Figure 5C:
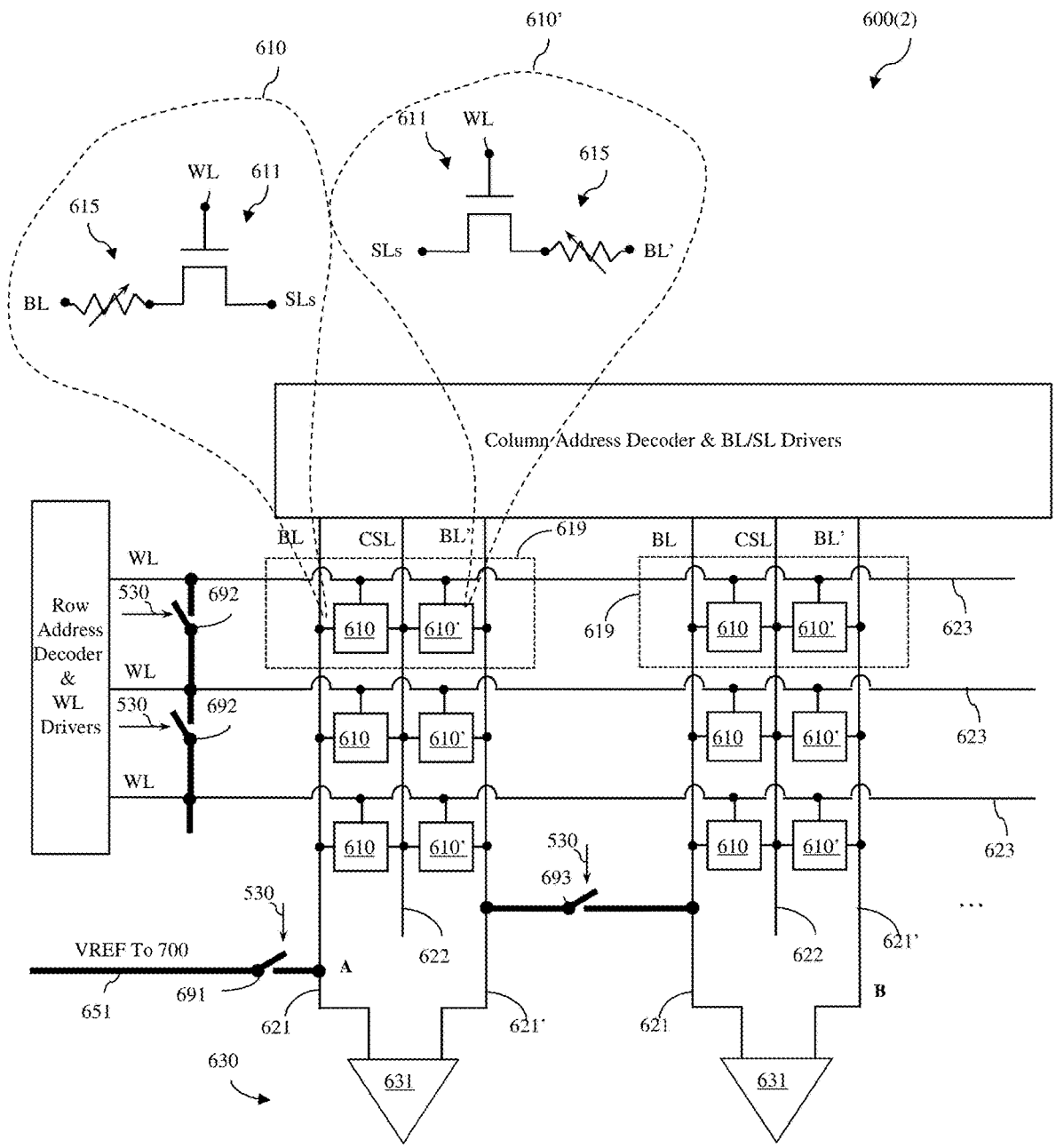

In some exemplary embodiments (e.g., 600(1) of FIG. 5B and 600(2) of FIG. 5C), due to the placement of the switch interconnects within the first memory array 600 and due to the biasing conditions used to generate the reference voltage (VREF) 651, the average resistance across all of the variable resistors of the first memory cells 619 within the series-parallel resistor network between nodes A and B will be dependent on the data values stored in those first memory cells 619 such that the reference voltage (VREF) 651 is data-dependent. However, in these embodiments even though the reference voltage (VREF) 651 is data-dependent, the configuration of the series-parallel resistor network and the biasing conditions are such that this average resistance will fall within a total resistance range having a minimum value that is above a low resistance (Rl) of a variable resistor in a nominal second memory cell in the second memory array 600 and a maximum value that is below a high resistance (Rh) of the variable resistor in the nominal second memory cell. Thus, the reference voltage (VREF) 651 is data-dependent.

Figure 5D:
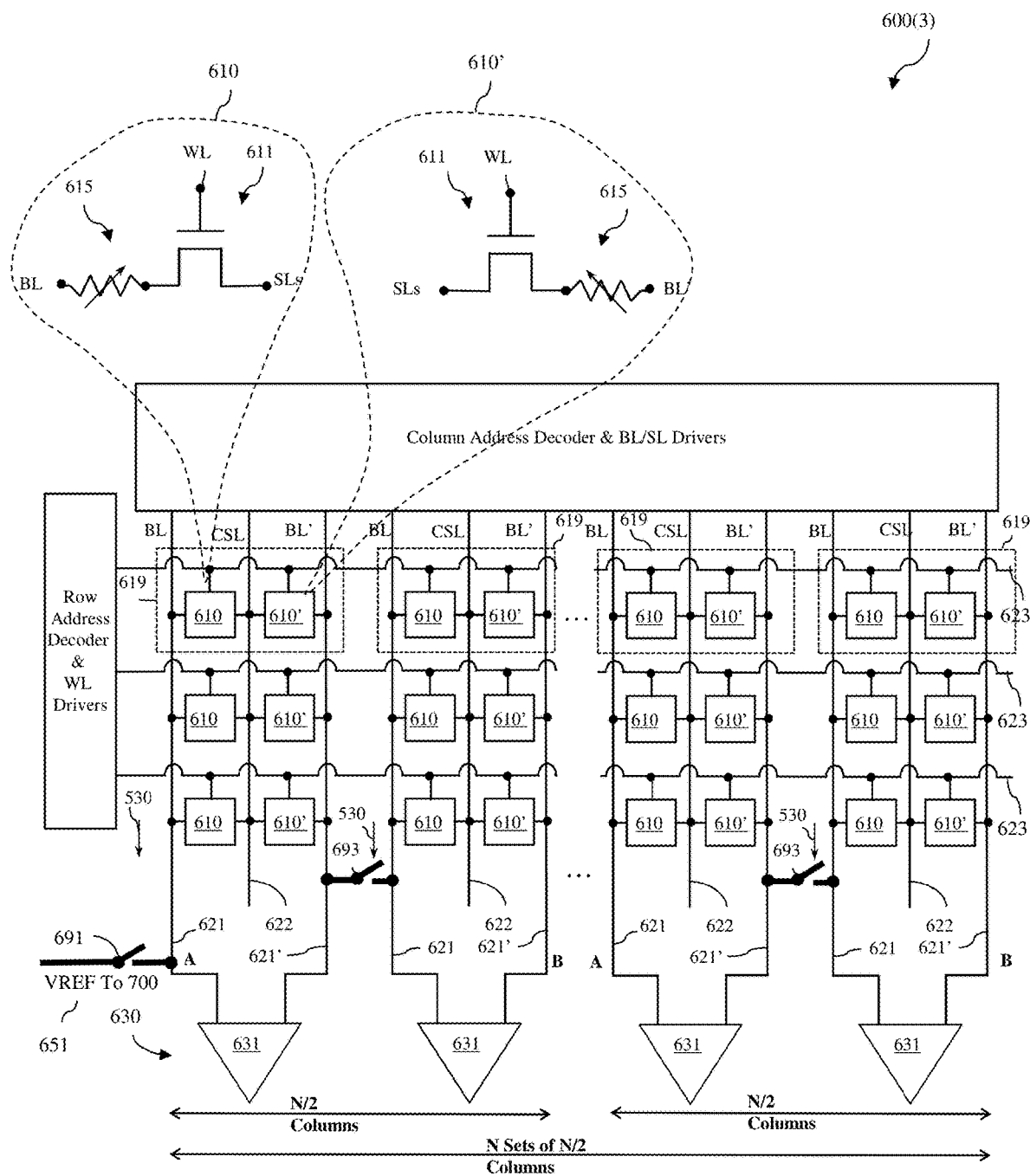
Figure 5E:
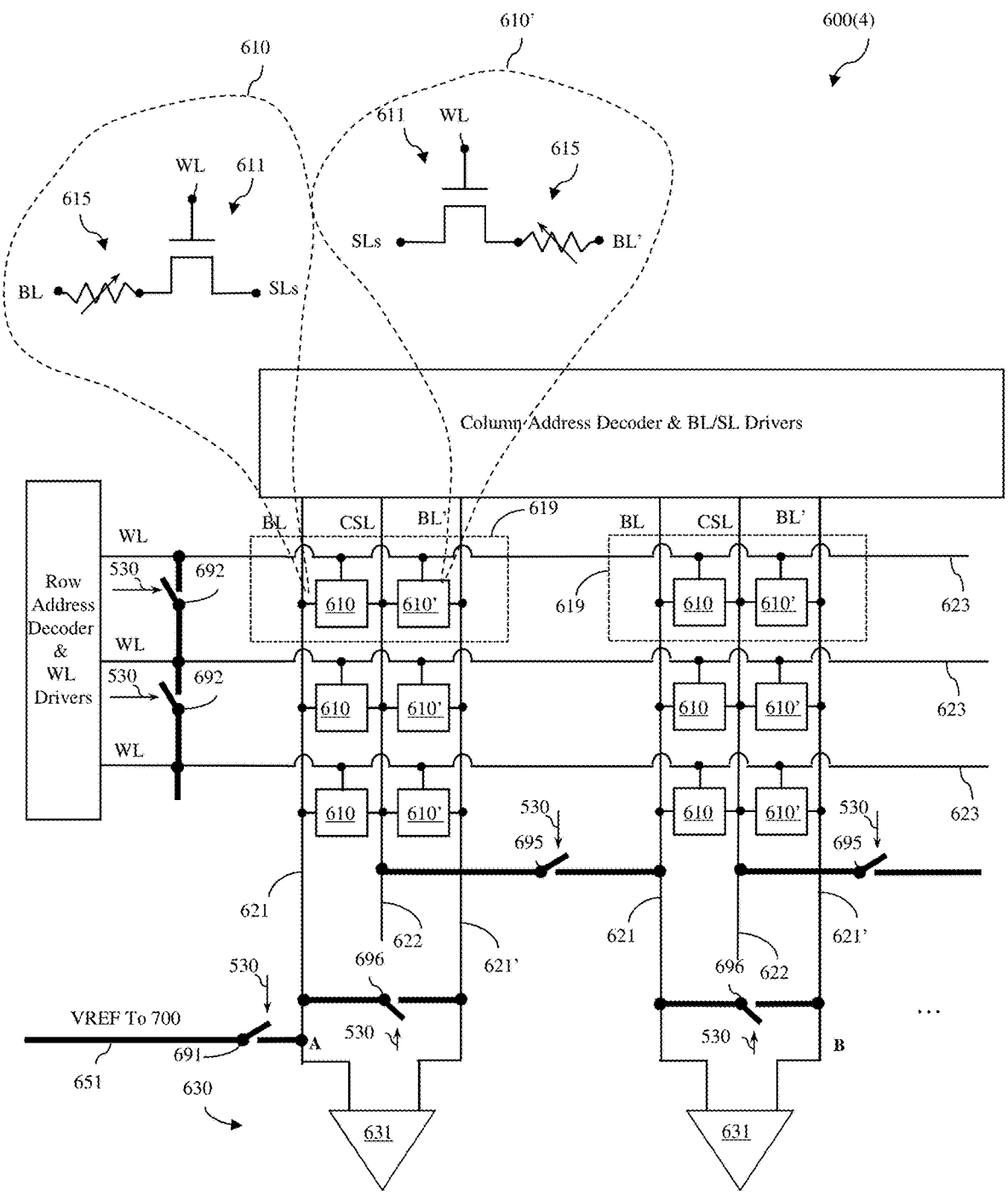
Figure 5F:
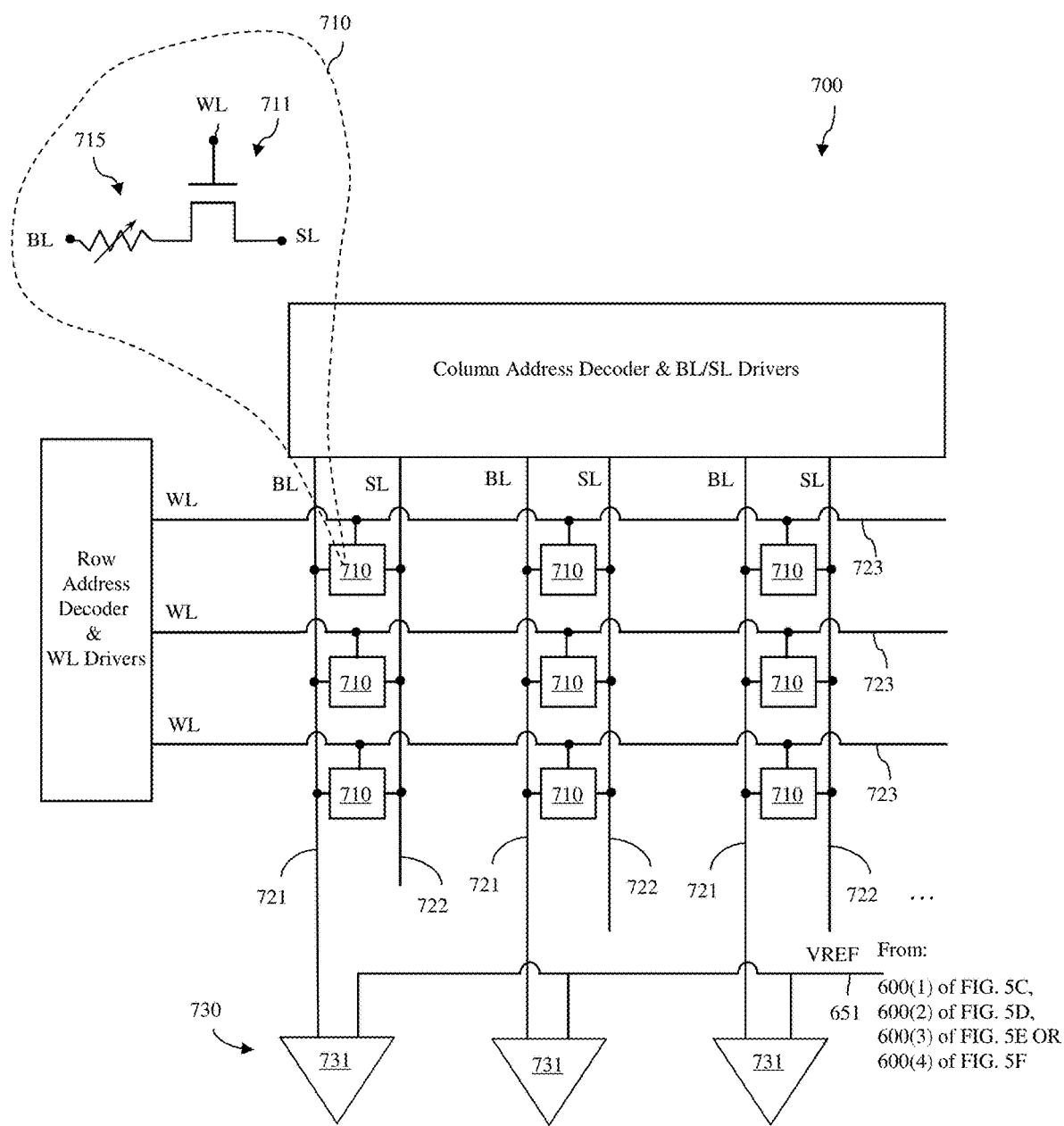
FIG. 5F is a schematic diagram illustrating an exemplary configuration for the second memory array of the resistive NVM structure of FIG. 5A.

In other exemplary embodiments (e.g., 600(3) of FIG. 5D and 600(4) of FIG. 5E), due to the placement of the switch interconnects within the first memory array 600 and due to the biasing conditions, the average resistance across all of the variable resistors in the first memory cells 619 within the series-parallel resistor network between nodes A and B will not be dependent on the data values stored in those first memory cells 619 such that the reference voltage (VREF) 651 is data-independent. In these embodiments, the configuration of the series-parallel resistor network and the biasing conditions are such that the average resistance will be a fixed value that is designed to be at a midpoint between a low resistance (Rl) of a variable resistor in a nominal second memory cell and a high resistance of the variable resistor in the nominal second memory cell. Thus, the reference voltage (VREF) 651 is data-independent and constant.

More specifically, FIG. 5B illustrates one exemplary first memory array 600(1) that can be incorporated into the NVM structure 500 of FIG. 5A and that can concurrently operate in a reference mode, whenever the second memory array 700 is operating in the read mode, in order to generate a reference voltage (VREF) 651 that is data-dependent. Specifically, the first memory array 600(1) can include multiple first memory cells 619 arranged in columns and rows. Each of the first memory cells 619 can be a two transistor-two variable resistor memory cell, which includes, for example, one NFET-variable resistor device 610 connected in series between a source line 622 and a bit line 621 and an additional NFET-variable resistor device 610' connected in series between an additional source line 622' and an additional bit line 621'. All first memory cells 619 in the same column are connected to the same bit line 621, additional bit line 621', source line 622 and additional source line 622', as illustrated. Additionally, all first memory cells 619 in the same row have transistor gates controlled by the same word line 623.

The first memory array 600(1) further includes a plurality of switch interconnects 691-694 that are controlled by the reference mode signal 530. Specifically, these switch interconnects can include a switch interconnect 691 between a node A, which is connected to an initial bit line of the first column of first memory cells 619 in the first memory array 600(1), and the sensing circuit 730 of the second memory array 700. These switch interconnects can further include switch interconnects 692 between adjacent word lines 623 of consecutive rows (e.g., of at least two consecutive rows, of more than two consecutive rows, of all rows, etc.). These switch interconnects can include switch interconnects 693 between adjacent bit lines of adjacent columns (including a bit line 621 from one column and an additional bit line 621' from an immediately adjacent column) in a group of consecutive columns (e.g., in a group of at least two consecutive columns, a group of more than two consecutive columns, a group of all columns, etc.). Finally, these switch interconnects can further include switch interconnects 694 between the source line 622 and the additional source line 622' within each column of the same group of columns.

Figure 6:
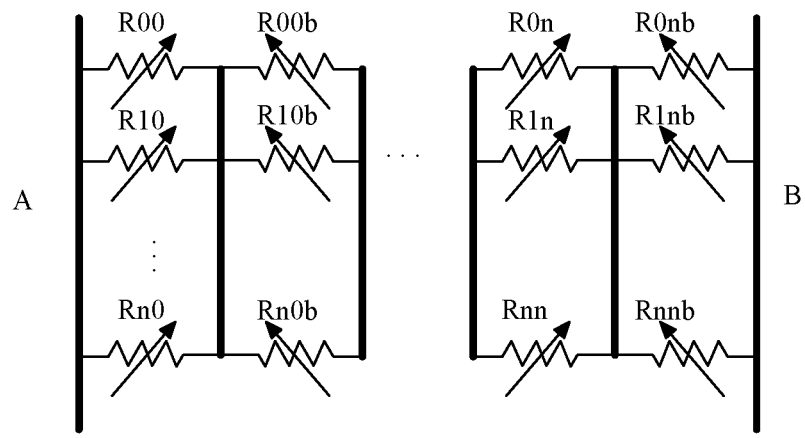
FIG. 6 is a schematic diagram illustrating a series-parallel resistor network created within the first memory array of FIG. 5B or 5C during reference mode operation.

In this exemplary first memory array 600(1), when the reference mode signal 530 switches to the second level, the switch interconnects 691-694 turn on. As a result, node A and, thereby the initial bit line 621 of the first column in the group of columns is electrically connected to the sense circuit 730 of the second memory array 700 by switch interconnect 691. Additionally, adjacent word lines 623 of the consecutive rows are electrically connected by switch interconnects 692, adjacent bit lines of adjacent columns (including a bit line 621 from one column and an additional bit line 621' from an immediately adjacent column) within a group of consecutive columns are electrically connected by switch interconnects 693, and the source line 622 and the additional source line 622' within each column of those same columns in the group are also electrically connected by switch interconnects 694, thereby forming a series-parallel resistor network 699(1) (e.g., see the exemplary series-parallel resistor network shown in FIG. 6).

FIG. 5C illustrates another exemplary first memory array 600(2) that can be incorporated into the NVM structure 500 of FIG. 5A and that can concurrently operate in a reference mode, whenever the second memory array 700 operates in the read mode in order to generate a reference voltage (VREF) 651 that is data-dependent. This first memory array 600(2) can include multiple first memory cells 619 arranged in columns and rows. Each of the first memory cells 619 can be a two transistor-two variable resistor memory cell, which includes, for example, one NFET-variable resistor device 610 connected in series between a common source line 622 and a bit line 621 and an additional NFET-variable resistor device 610' connected in series between the common source line 622 and an additional bit line 621'. All first memory cells 619 in the same column are connected to the same bit line 621, additional bit line 621', and common source line 622, as illustrated. Additionally, all first memory cells 619 in the same row have transistor gates controlled by the same word line 623.

The first memory array 600(2) can further include a plurality of switch interconnects 691-693 that are controlled by the reference mode signal 530. Specifically, these switch interconnects can include a switch interconnect 691 between a node A, which is connected to an initial bit line of the first column of first memory cells 619 in the first memory array 600(2), and the sensing circuit 730 of the second memory array 700. These switch interconnects can further include switch interconnects 692 between adjacent word lines 623 (e.g., of at least two consecutive rows, of more than two consecutive rows, of all rows, etc.). These switch interconnects can further include switch interconnects 693 between adjacent bit lines of adjacent columns (including a bit line 621 from one column and an additional bit line 621' from an immediately adjacent column) in a group of consecutive columns (e.g., in a group of at least two consecutive columns, of more than two consecutive columns, of all columns, etc.). It should be noted that in this exemplary first memory array 600(2), switch interconnects 694 are not included because a common source line is incorporated into each column (as opposed to two discrete source lines).

In this exemplary first memory array 600(2), when the reference mode signal 530 switches to the second level, these switch interconnects 691-693 turn on. As a result, node A and, thereby the initial bit line 621 of the first column (consecutively) of the group is electrically connected to the sense circuit 730 of the second memory array 700 by switch interconnect 691. Additionally, adjacent word lines 623 of consecutive rows are electrically connected by switch interconnects 692 and adjacent bit lines of adjacent columns (including a bit line 621 from one column and an additional bit line 621' from an immediately adjacent column) within the group of consecutive columns are electrically connected by switch interconnects 693, thereby forming a series-parallel resistor network 699(2) that will be essentially the same as the series-parallel resistor network 699(1) formed using the exemplary first memory array 600(1) (e.g., see the exemplary series-parallel resistor network shown in FIG. 6).

The series-parallel resistor network 699(1) formed within the first memory array 600(1) of FIG. 5B or the series-parallel resistor network 699(2) formed within the first memory array 600(2) of FIG. 5C can be biased during the reference mode by activating the word lines 623 (e.g., applying a high positive voltage (VDD) to the word lines through the word line drivers), applying a read current (READ) to only the initial bit line 621 of the first column (consecutively) in the group (e.g., using a bit line driver to connect that specific bit line to a current source), and grounding only the last additional bit line 621' of the last column (consecutively) of the group (e.g., through node B). Depending upon any data that is currently stored within the first memory cells 619 in the series-parallel resistor network 699(1) or 699(2), the effective resistance (Reff) between nodes A and B can vary from a minimum resistance (R min) to a maximum resistance (R max) as follows:

$$R \text{ min}=2*Rl*Rh/(Rl+Rh)\text{to} \quad (1)$$

$$R \text{ max}=(Rl+Rh)/2, \quad (2)$$

where Rl refers to the low resistance of each variable resistor and Rh refers to the high resistance of each variable resistor. For example, if Rl=3 kilo-ohms (k) and Rh=7 k, then the effective resistance (Reff) that results in the reference voltage (VREF) 651 can vary between an R min of 4.2 k and an R max of 5 k. However, the standard deviation (σ) of the resistance distribution will be extremely small.

Figure 7:
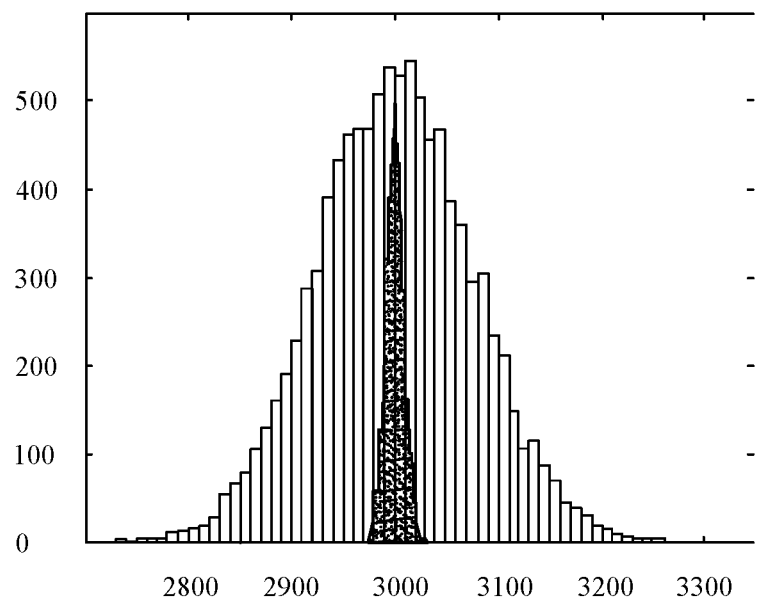
FIG. 7 is a graph illustrating that the series-parallel resistor network of FIG. 6 captures average process variations across the resistors within the first memory array.

As mentioned above, each variable resistor within each memory cell in the first memory array 600(1) of FIG. 5B or 600(2) of FIG. 5C has a distribution on its low and high resistances due to random process and thermal variations. In the resulting series-parallel resistor network 699(1) or 699(2), at least some of the variable resistors of the memory cells of the memory array are connected, thereby capturing the average process variations of the whole array to statistically sharpen the resistance distribution (as shown in the graph of FIG. 7). Thus, despite being data-dependent, the reference voltage (VREF) 651 generated at node A and output to the second memory array 700 is more robust compared to prior art reference voltages generated by a single reference cell.

It should be noted that the total number of first memory cells 619 that should be used to form the series-parallel resistor network 699(1) or 699(2) can be predetermined to achieve the desired statistical reference and can be adjusted by adjusting the number of word lines of consecutive rows connected by switch interconnects 692 and/or the number adjacent bit lines of adjacent columns connected by switch interconnects 693. For the most robust statistical references, the switch interconnects within the first memory array 600(1) or 600(2) can be placed so that, during the reference mode, all the word lines for all consecutive rows are electrically connected and so that the adjacent bit lines of any adjacent columns (including a bit line 621 from one column and an additional bit line 621' from an immediately adjacent column) are electrically connected. However, alternatively, a fewer number of rows or columns of the first memory cells 619 can be incorporated into the series-parallel resistor network 699(1) or 699(2) balancing the need for a more robust statistical reference with the need for power savings and/or area consumption savings.

FIG. 5D illustrates an exemplary first memory array 600(3) that can be incorporated into the NVM structure 500 of FIG. 5A and that can concurrently operate in a reference mode, whenever the second memory array 700 is operating in the read mode, in order to generate a reference voltage (VREF) 651 that is essentially data-independent. This first memory array 600(3) can include multiple first memory cells 619 arranged in columns and rows. Each of the first memory cells 619 can be a two transistor-two variable resistor memory cell, which includes, for example, one NFET-variable resistor device 610 connected in series between a common source line 622 and a bit line 621 and an additional NFET-variable resistor device 610' connected in series between the common source line 622 and an additional bit line 621'. All first memory cells 619 in the same column are connected to the same bit line 621, additional bit line 621', and common source line 622, as illustrated. Additionally, all first memory cells 619 in the same row have transistor gates controlled by the same word line 623.

In this exemplary first memory array 600(3), the columns of first memory cells 619 can be organized into some number N of sets (i.e., into a first predetermined number of sets of columns) with each set including N/2 columns (i.e., with each set including a second predetermined number of columns that is equal to the first predetermined number divided by two). For example, the first memory array 600(3) could include a total of 128 consecutive columns. In this case, the 128 consecutive columns can be organized into 16 sets of columns with each set including 8 columns. It should be noted that in FIG. 2D only 2 sets of columns each including only 2 columns are shown for purposes of illustration. It should be understood that this figure is not intended to be limiting and that the number of sets and number of columns within each set will depend on the total number of columns within the array. In any case, in each of the N sets, the initial bit line 621 of the first column (consecutively) in the set can be connected to a common first node (node A), which is selectively connectable to the sensing circuit 730 of the second memory array 700, and the last additional bit line 621' of the last column (consecutively) in the set can be connected to an additional common node B, which is connected to ground.

The first memory array 600(3) can further include a plurality of switch interconnects 691 and 693 that are controlled by the reference mode signal 530. These switch interconnects can include a switch interconnect 691 between the common node A (and thereby the initial bit line of the first column in each of the N sets of columns) and the sensing circuit 730 of the second memory array 700. These switch interconnects can further include switch interconnects 693 between adjacent bit lines of adjacent columns (including a bit line 621 from one column and an additional bit line 621' from an immediately adjacent column) within each set of columns. It should be noted that in this exemplary first memory array 600(3), switch interconnects 692 and 694 are not included because word line connections are not employed and because a common source line is incorporated into each column (as opposed to two discrete source lines).

Figure 8:
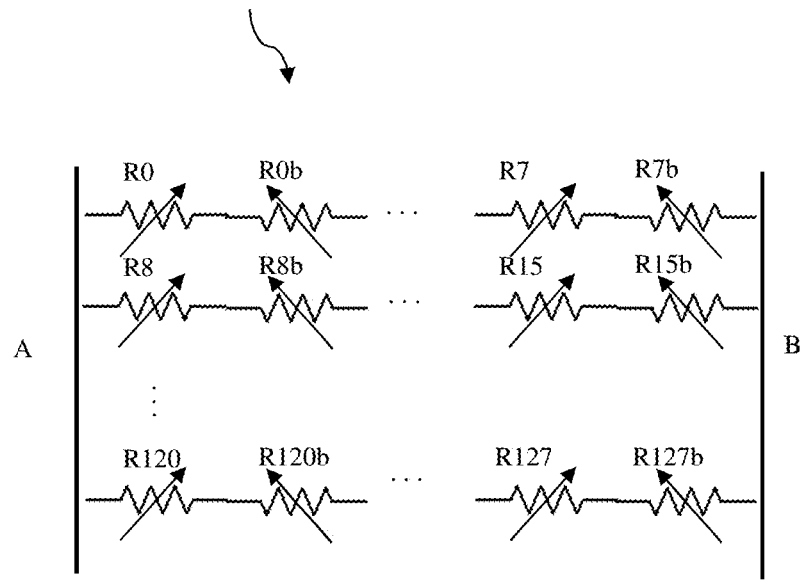
FIG. 8 is a schematic diagram illustrating a series-parallel resistor network created within the first memory array of FIG. 5D during reference mode operation.

In this exemplary first memory array 600(3), when the reference mode signal switches to the second level, the switch interconnects 691 and 693 turn on. As a result, common node A and, thereby each initial bit line 621 of each first column of each set is electrically connected to the sense circuit 730 of the second memory array 700 by switch interconnect 691. Additionally, adjacent bit lines of adjacent columns (including a bit line 621 from one column and an additional bit line 621' from an immediately adjacent column) within each set are electrically connected by switch interconnects 693, thereby forming a series-parallel resistor network 699(3) (see FIG. 8, which shows an exemplary series-parallel resistor network 699(3) for a first memory array 600(3), which has been configured as described above with 128 columns organized into 16 sets of 8 columns each).

Since each of the sets is connected between the same two common nodes A and B, they are all connected in parallel.

The series-parallel resistor network 699(3) formed within the first memory array 600(3) of FIG. 5D can be biased during the reference mode by activating a selected one of the word lines 623, such as the first word line for the first row (e.g., applying a high voltage (VDD) to the selected word line through a word line driver), applying a read current (IREAD) to only the initial bit line 621 of each first column of each set (e.g., using a bit line driver to connect that specific bit line to a current source), and grounding only the last additional bit line 621' of the last column of each set (e.g., through node B). In this case, the reference voltage (VREF) 651 generated at the common node A will be data-independent. Specifically, the effective resistance for each set of columns between common nodes A and B will be fixed and essentially independent of the data stored within the first memory cells of those columns. That is, each of the sets of columns (e.g., each of the 16 sets of 8 columns) can have an effective resistance equal to the following:

$$Reff=8*(Rl+Rh), \quad (3)$$

where Rl refers to the low resistance of each variable resistor and Rh refers to the high resistance of each variable resistor. Additionally, since each of these 16 sets are connected in parallel by common nodes A and B, thereby forming the series-parallel resistor network 699(3), the total overall effective resistance for the network 699(3) between nodes A and B will be equal to the following:

$$Rtotal=8*(Rl+Rh)/16=Rl+Rh/2. \quad (4)$$

Thus, for example, if Rl=3 kilo-ohms (k) and Rh=7 k, then the total effective resistance (Rtotal) that results in the reference voltage (VREF) 651 at node A will be 5 k independent of the data stored within the first memory cells 619.

FIG. 5E illustrates yet another exemplary first memory array 600(4) that can be incorporated into the NVM structure 500 of FIG. 5A and that can concurrently operate in a reference mode, whenever the second memory array 700 is operating in the read mode, in order to generate a reference voltage (VREF) 651 that is essentially data-independent. This first memory array 600(4) can include multiple first memory cells 619 arranged in columns and rows. Each of the first memory cells 619 can be a two transistor-two variable resistor memory cell, which includes, for example, one NFET-variable resistor device 610 connected in series between a common source line 622 and a bit line 621 and an additional NFET-variable resistor device 610' connected in series between the common source line 622 and an additional bit line 621'. All first memory cells 619 in the same column are connected to the same bit line 621, additional bit line 621', and common source line 622, as illustrated. Additionally, all first memory cells 619 in the same row have transistor gates controlled by the same word line 623.

The first memory array 600(4) can further include a plurality of switch interconnects 691-692 and 695-696 that are controlled by the reference mode signal 530. These switch interconnects can include a switch interconnect 691 between a node A, which is connected to an initial bit line of the first column of first memory cells 619 in the first memory array 600(4), and the sensing circuit 730 of the second memory array 700. These switch interconnects can further include switch interconnects 692 between adjacent word lines 623 (e.g., of at least two consecutive rows, of more than two consecutive rows, of all rows, etc.). These switch interconnects can further include switch interconnects 695 between the common source line 622 and the bit line 621 of each pair of adjacent columns (i.e., between the common source line of one column and the bit line of another column for each pair of adjacent columns) of a group of consecutive columns (which includes at least two consecutive columns, more than two consecutive columns, all columns, etc.). These switch interconnects can further include switch interconnects 696 between the bit line 621 and the additional bit line 621' within each column in the group.

In this exemplary first memory array 600(4), when the reference mode signal 530 switches to the second level, the switch interconnects 691-692 and 695-696 turn on. As a result, node A and, thereby the initial bit line 621 of the first column (consecutively) in the group of consecutive columns is electrically connected to the sense circuit 730 of the second memory array 700 by switch interconnect 691. Additionally, adjacent word lines 623 of consecutive rows are electrically connected by switch interconnects 692. Within each pair of adjacent columns in the group, the common source line 622 of one column and the bit line 621 of the adjacent column are electrically connected by switch interconnects 695. Finally, within each column in the group, the bit line 621 and the additional bit line 621' are electrically connected by the switch interconnects 696. These connections result in the formation of a series-parallel resistor network 699(4) (e.g., as shown in FIG. 9).

The series-parallel resistor network 699(4) formed within the first memory array 600(4) of FIG. 5E can be biased during the reference mode by activating the word lines 623 (e.g., applying a high positive voltage (VDD) to the word lines through the word line drivers), applying a read current (IREAD) to only the initial bit line 621 of the first column of the consecutive columns (e.g., using a bit line driver to connect that specific bit line to a current source), and grounding only the last common source line 622 of the last column of the consecutive columns (e.g., through node B). In this case, the reference voltage (VREF) 651 generated at the common node A will also be data-independent. Specifically, in this embodiment, biasing will activate Nr rows and Nc columns. In every one of these Nc columns, the MTJs connected to the bit line 621 and the MTJs connected to the additional bit line 621' are connected in parallel. Thus, with Nr rows being active, each column will have the following effective resistance (Rcol):

$$Rcol = Rl*Rh/Nr(Rl+Rh). \quad (5)$$

Figure 9:
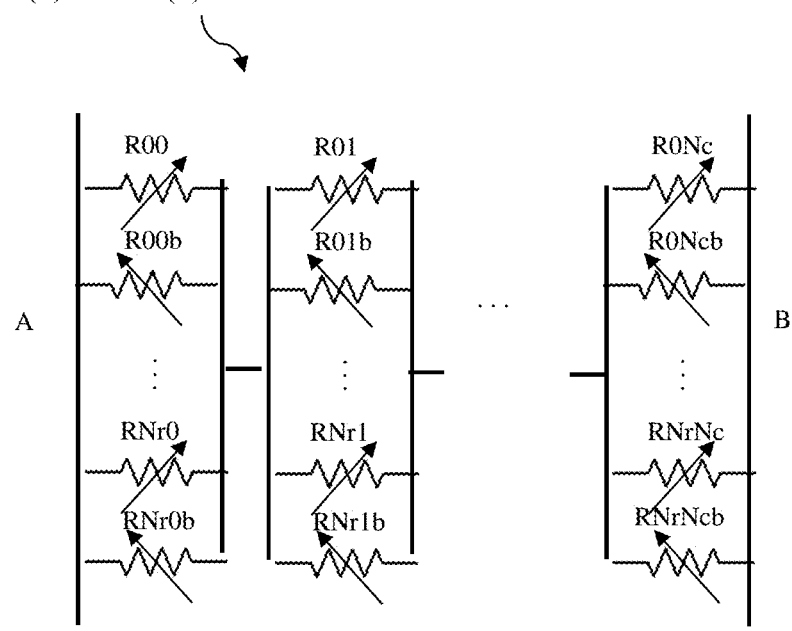
FIG. 9 is a schematic diagram illustrating a series-parallel resistor network created within the first memory array of FIG. 5E during reference mode operation.

Furthermore, with Nc columns being active, and the resistances being connected in series, as shown in FIG. 9, the total effective resistance (Rtotal) between nodes A and B will be fixed as follows:

$$Rtotal = Rl*Rh/Nr(Rl+Rh)Nc. \quad (6)$$

It should be noted that, since the desired reference resistance is Rl+Rh/2, the above expression for the total effective resistance can be equated to obtain the following expression:

$$(Nc/Nr) = 1 + Rr/2 + \frac{1}{2}*Rr, \quad (7)$$

where Rr refers to the resistance ratio of Rh/Rl (also referred to as the resistance on (Ron)/resistance off (Roff) ratio). Thus, for every technology node, given the Rr, the ratio (Nc/Nr) can be evaluated to design the desired series-parallel resistor network to achieve the desired reference voltage.

The resistive NVM structure 500 embodiments described above and illustrated in the drawings are shown with one first memory array 600 and one second memory array 700. However, those skilled in the art will recognize that a resistive NVM structure will often include multiple memory arrays and, particularly, more than two memory arrays. Thus, for example, it should be understood that additional embodiments of the disclosed resistive NVM structure can include multiple first memory arrays 600 with first memory cells 619, as described above, and multiple second memory arrays 700 with second memory cells 710, as described above. At least one first memory array 600 can be interleaved with a corresponding second memory array 700 so that the first memory array 600 can provide the reference voltage (VREF) 651 to the second memory array 700 during a read operation. For example, one or more of the first memory arrays 600 can be interleaved with corresponding second memory arrays 700 so that those first memory arrays 600 can provide the reference voltages (VREF) 651 to the corresponding second memory arrays 700 during read operations. For example, all of the first memory arrays 600 can be interleaved with corresponding second memory arrays 700 so that those first memory arrays 600 can provide the reference voltages (VREF) 651 to the corresponding second memory arrays 700 during read operations.

Figure 10:
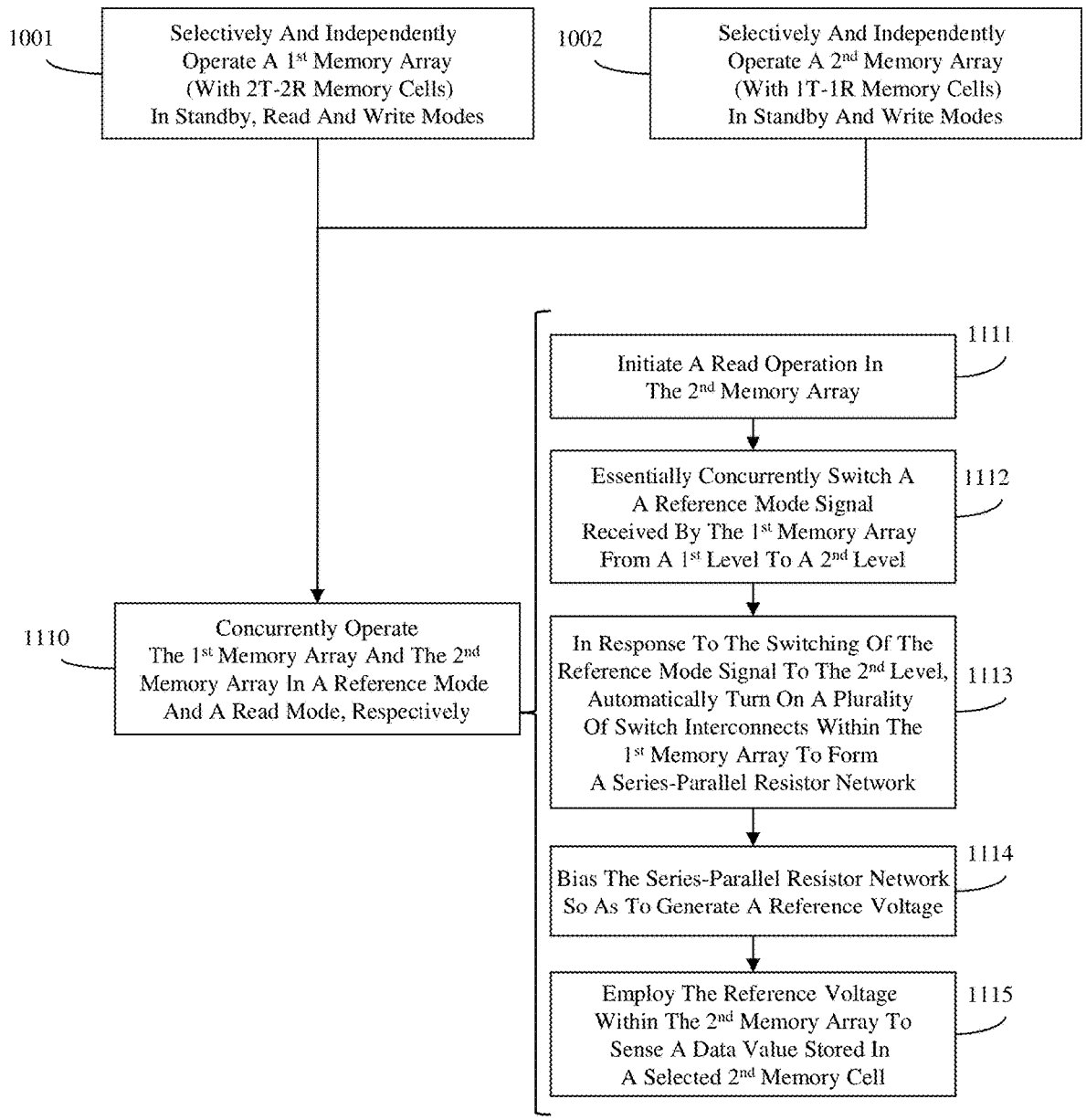
FIG. 10 is a flow diagram illustrating embodiments of a method of operating a resistive NVM structure.

Referring to the flow diagram of FIG. 10, also disclosed herein are embodiments of a sensing method that can be employed within a resistive nonvolatile memory (NVM) structure, as described above, that includes at least two resistive NVM arrays. Specifically, as discussed in detail above and illustrated in FIG. 5A, the NVM structure 500 can include at least two resistive NVM arrays including a first memory array 600 (e.g., see exemplary first memory arrays 600(1)-600(4) of FIGS. 5B-5E, respectively, that can be incorporated into the resistive NVM structure 500 and the discussion thereof above) and a second memory array 700 (e.g., see exemplary second memory array 700 of FIG. 5F that can be incorporated into the NVM structure 500 and the discussion thereof above).

The first memory array 600 can include first memory cells 619 and, particularly, two transistor-two variable resistor (2T-2R) memory cells, and the second memory array 700 can include second memory cells 710 and, particularly, one transistor-one variable resistor (1T-1R) memory cells. In one exemplary embodiment, the first memory array 600 (including the alternative possible configurations) and the second memory array 700 can be spin transfer torque-magnetic random access memory (STT-MRAM) arrays, where the two variable resistors in each first memory cell of the first memory array 600 and the one variable resistor in each second memory cell of the second memory array 700 are all magnetic tunnel junctions (MTJs). In other exemplary embodiments, other types of resistive NVM arrays with other types of variable resistors can be employed. For example, the resistive NVM arrays 600, 700 can be phase change random access memory (PCRAM) arrays, where the two variable resistors of each first memory cell in the first memory array 600 and the one variable resistor of each second memory cell in the second memory array 700 are phase change material layers. Alternatively, the resistive NVM arrays 600, 700 can be resistive random access memory (RRAM or ReRAM) arrays, where the two variable resistors of each first memory cell in the first memory array 600 and the one variable resistor of each second memory cell in the second memory array 700 are memristors. Alternatively, the resistive NVM arrays 600, 700 can be any other suitable type of resistive NVM arrays where a variable resistor in a memory cell can be appropriately biased (i.e., programmed) during a write operation to exhibit either a low resistance (for storage of a "0" bit) or a high resistance (for storage of a "1" bit).

The method can include selectively and independently operating the first memory array 600 in read, write and standby modes (see process step 1001). The method can further include selectively and independently operating the second memory array 700 in write and standby modes (see process step 1002). Additionally, the method can include concurrently operating the first memory array 600 and the second memory array 700 in a reference mode and a read mode, respectively (see process step 1110) and, more particularly, operating the first memory array 600 in the reference mode, whenever the second memory array 700 is operating in the read mode.

To accomplish concurrent operation of the first memory array 600 in the reference mode and the second memory array 700 in the read mode at process step 1110, the method can further include initiating a read operation in the second memory array 700 (see process step 1111). For example, the second memory array 700 can receive control signals 520 from a memory controller 501 and these control signals 520 can cause the state of the second memory array 700 to switch to a read mode and can further cause read operations to be formed with respect to selected second memory cell(s) 710 within the second memory array 700.

The method can further include essentially concurrently switching a reference mode signal 530 from a first level to a second level (see process step 1112). This reference mode signal 530 can be received by the first memory array 600 from the memory controller 501 or, alternatively, from the second memory array 700. This reference mode signal 530 can control a plurality of switch interconnects within the first memory array 600. When the reference mode signal 530 is at the first level, the switch interconnects will be maintained in an off state, thereby allowing operation of the first memory array 600 in read, write or standby modes as dictated by control signals 510 from the memory controller 501.

However, when the second memory array 700 switches to the read mode and the reference mode signal 530 essentially concurrently switches from the first level to the second level, the switch interconnects with the first memory array 600 can turn on, automatically triggering operation of the first memory array 600 in the reference mode. Specifically, when the switch interconnects turn on, electrical connections can be made within the first memory array 600 between at least some of the first memory cells 619 (or, more particularly, between various lines connected to these cells), thereby forming a series-parallel resistor network that incorporates at least some of the first memory cells 619 (see process step 1113). An additional electrical connection is also made between a node A in the series-parallel resistor network and a sense circuit 730 in the second memory array 700.

The method can further include biasing this series-parallel resistor network in such a way as to generate a reference voltage (VREF) 651 at node A (see process step 1114). This reference voltage (VREF) 651 can be received by the second memory array 700 (due to the established electrical connection).

The method can further include employing this reference voltage (VREF) 651 within the second memory array 700 during a read operation to sense a data value stored in a selected second memory cell 710 (see process step 1115). Specifically, during the read operation within the second memory array 700, a high positive voltage (VDD) can be applied by a word line driver to the word line 723 for the row containing the selected second memory cell 710, a low positive voltage (VREAD) can be applied to the bit line 721 for the column containing the selected second memory cell 710 and the source line 722 for that same column can be connected to ground. In this case, a low resistance state (e.g., a logic "0") will be indicated by a low voltage on the bit line and a high resistance state (e.g., a logic "1") will be indicated by a high voltage on the bit line. To detect whether there is a low voltage or a high voltage on the bit line, a sense amplifier (SA) 731 for the column is employed to compare the voltage (VDATA) on the bit line to the reference voltage (VREF) 651 from the series-parallel resistor network formed within the first memory array 600. Even though the range between the low voltage and the high voltage is relatively small, given the statistical reference voltage generated by the series-parallel resistor network, read errors will be minimized.

As discussed in detail above, in some exemplary embodiments disclosed herein (e.g., see exemplary first memory arrays 600(1) of FIG. 5B and 600(2) of FIG. 5C), due to the placement of the switch interconnects within the first memory array 600, the reference voltage (VREF) 651 that is generated by the series-parallel resistor network at process step 1114 is data-dependent (i.e., dependent upon the data values stored in the second memory cells 710 within the series-parallel resistor network). However, since the standard deviation (σ) of the resistance distribution will be extremely small, read errors are still significantly minimized. In other exemplary embodiments disclosed herein (e.g., see exemplary first memory arrays 600(3) of FIG. 5D and 600(4) of FIG. 5E), due to the placement of the switch interconnects within the first memory array 600, the reference voltage (VREF) 651 that is generated by the series-parallel resistor network is data-independent (i.e., not dependent upon the data values stored in the second memory cells within the series-parallel resistor network) and constant.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A nonvolatile memory structure comprising:
    a first memory array comprising: first memory cells arranged in columns and rows; and
    word lines for the rows of the first memory cells, respectively, wherein the first memory cells comprise two transistor-two variable resistor memory cells and wherein each word line for each row of the first memory cells is connected to all transistor gates of all two transistor-two variable resistor memory cells in the row; and
    a second memory array comprising second memory cells with each second memory cell comprising a one transistor-one variable resistor memory cell,
    wherein the first memory array and the second memory array concurrently operate in a reference mode and a read mode, respectively, with the first memory array generating a reference voltage and the second memory array employing the reference voltage to sense a data value stored in a selected second memory cell.

2. The nonvolatile memory structure of claim 1, wherein the reference voltage is dependent on data values stored in the first memory cells.

3. The nonvolatile memory structure of claim 1,
    wherein the first memory cells and the second memory cells comprise any of:
        spin transfer torque-magnetic random access memory cells with magnetic tunnel junction-type variable resistors;
        phase change memory cells with phase change material layer-type variable resistors; and
        resistive random access memory cells with memristor-type variable resistors, and
    wherein low and high resistance states of variable resistors in the first memory cells and the second memory cells vary due to random process and thermal variations.

4. The nonvolatile memory structure of claim 1,
    wherein operation of the first memory array in the reference mode is triggered by switching of a reference mode signal from a first level to a second level,
    wherein the reference mode signal controls a plurality of switch interconnects within the first memory array, and
    wherein, when the reference mode signal is at the second level, the switch interconnects cause at least some of the first memory cells in the first memory array to be electrically connected in a series-parallel resistor network that generates the reference voltage and further cause the series-parallel resistor network to be electrically connected to a sense circuit in the second memory array.

5. The nonvolatile memory structure of claim 4,
    wherein the reference voltage generated by the series-parallel resistor network is a statistical reference voltage that is proportional to an average resistance across all of the first memory cells within the series-parallel resistor network, and
    wherein, due to placement of the switch interconnects within the first memory array, the average resistance is dependent on data values stored in the first memory cells and falls within a total resistance range having a minimum value that is above a low resistance state of a variable resistor of a nominal second memory cell and a maximum value that is below a high resistance state of the variable resistor of the nominal second memory cell such that the reference voltage is data-dependent.

6. The nonvolatile memory structure of claim 5,
    wherein each column in the first memory array comprises a bit line, a source line, an additional source line, an additional bit line, and multiple two transistor-two variable resistor memory cells, each comprising: a transistor-variable resistor device connected in series between the source line and the bit line and an additional transistor-variable resistor device connected in series between the additional source line and the additional bit line.

7. The nonvolatile memory structure of claim 6, wherein, upon receiving the reference mode signal at the second level, the switch interconnects electrically connect word lines of at least two consecutive rows, electrically connect the source line to the additional source line within each column of at least two consecutive columns, and electrically connect adjacent bit lines of adjacent columns of the at least two consecutive columns.

8. The nonvolatile memory structure of claim 5,
    wherein each column in the first memory array comprises a bit line, a common source line, an additional bit line, and multiple two transistor-two variable resistor memory cells, each comprising: a transistor-variable resistor device connected in series between the common source line and the bit line and an additional transistor-variable resistor device connected in series between the common source line and the additional bit line.

9. The nonvolatile memory structure of claim 8, wherein, upon receiving the reference mode signal at the second level, the switch interconnects electrically connect word lines of at least two consecutive rows and electrically connect adjacent bit lines of adjacent columns of at least two consecutive columns.

10. A nonvolatile memory structure comprising:
    a first memory array comprising: first memory cells arranged in columns and rows; and word lines for the rows of the first memory cells, respectively, wherein the first memory cells comprise two transistor-two variable resistor memory cells and wherein each word line for each row of the first memory cells is connected to all transistor gates of all two transistor-two variable resistor memory cells in the row; and
    a second memory array comprising second memory cells arranged in columns and rows, with each second memory cell comprising a one transistor-one variable resistor memory cell,
    wherein the first memory array and the second memory array concurrently operate in a reference mode and a read mode, respectively, with the first memory array generating and outputting a reference voltage to the second memory array and the second memory array employing the reference voltage to sense a data value stored in a selected second memory cell, and wherein the reference voltage is independent of data values stored in the first memory cells and constant.

11. The nonvolatile memory structure of claim 10, wherein the first memory cells and the second memory cells comprise any of:
- spin transfer torque-magnetic random access memory cells with magnetic tunnel junction-type variable resistors;
- phase change memory cells with phase change material layer-type variable resistors; and
- resistive random access memory cells with memristor-type variable resistors, and wherein low and high resistance states of variable resistors in the first memory cells and the second memory cells vary due to random process and thermal variations.

12. The nonvolatile memory structure of claim 10, wherein operation of the first memory array in the reference mode is triggered by switching of a reference mode signal from a first level to a second level, wherein the reference mode signal controls a plurality of switch interconnects within the first memory array, wherein, when the reference mode signal is at the second level, the switch interconnects cause at least some of the first memory cells in the first memory array to be electrically connected in a series-parallel resistor network that generates the reference voltage and further cause the series-parallel resistor network to be electrically connected to a sense circuit in the second memory array, wherein the reference voltage generated by the series-parallel resistor network is a statistical reference voltage that is proportional to an average resistance across all first memory cells within the series-parallel resistor network, and wherein, due to placement of the switch interconnects within the first memory array, the average resistance is independent of data values stored in the first memory cells and has a fixed value at a midpoint between a low resistance state of a variable resistor in a nominal second memory cell and a high resistance state of the variable resistor in the nominal second memory cell such that the reference voltage is data-independent.

13. The nonvolatile memory structure of claim 12, wherein each column in the first memory array comprises a bit line, a common source line, and an additional bit line, and multiple two transistor-two variable resistor memory cells, each comprising: a transistor-variable resistor device connected in series between the common source line and the bit line and an additional transistor-variable resistor device connected in series between the common source line and the additional bit line.

14. The nonvolatile memory structure of claim 13, wherein the columns in the first memory array include sets of columns with each set having an initial bit line connected to a common node that is selectively connectable by one of the switch interconnects to the sense circuit of the second memory array and a last additional bit line connected to ground, and wherein, upon receiving the reference mode signal at the second level, the switch interconnects electrically connect adjacent bit lines of adjacent columns within each of the sets of columns.

15. The nonvolatile memory structure of claim 14, wherein the first memory array comprises a first predetermined number of the sets of columns with each set comprising a second predetermined number of columns that is equal to the first predetermined number divided by two.

16. The nonvolatile memory structure of claim 13, wherein, upon receiving the reference mode signal at the second level, the switch interconnects electrically connect word lines of consecutive rows, electrically connect the common source line of one column to the bit line of another column for each pair of adjacent columns and further electrically connect the bit line and the additional bit line within each column.

17. A method comprising:
- operating a first memory array in a reference mode such that the first memory array generates and outputs a reference voltage, wherein the first memory array comprises first memory cells arranged in columns and rows; and word lines for the rows of the first memory cells, respectively, wherein the first memory cells comprise two transistor-two variable resistor memory cells and wherein each word line for each row of the first memory cells is connected to all transistor gates of all two transistor-two variable resistor memory cells in the row; and
- concurrently operating a second memory array in a read mode, wherein the second memory array comprises second memory cells with each second memory cell comprising a one transistor-one variable resistor memory cell and wherein the concurrently operating of the second memory array in the read mode is performed such that the second memory array receives the reference voltage from the first memory array and employs the reference voltage to sense a data value stored in a selected second memory cell.

18. The method of claim 17, further comprising triggering operation of the first memory array in the reference mode by automatically switching a reference mode signal from a first level to a second level when the second memory array switches to the read mode, wherein the reference mode signal controls a plurality of switch interconnects within the first memory array, wherein, when the reference mode signal is at the second level, the switch interconnects cause at least some of the first memory cells in the first memory array to be electrically connected in a series-parallel resistor network that generates the reference voltage and further cause the series-parallel resistor network to be electrically connected to a sense circuit in the second memory array, and wherein the reference voltage generated by the series-parallel resistor network is a statistical reference voltage that is proportional to an average resistance across all first memory cells within the series-parallel resistor network.

19. The method of claim 18, wherein the first memory cells and the second memory cells comprise any of:
- spin transfer torque-magnetic random access memory cells with magnetic tunnel junction-type variable resistors;
- phase change memory cells with phase change material layer-type variable resistors; and resistive random access memory cells with memristor-type variable resistors, and wherein low and high resistance states of variable resistors in the first memory cells and the second memory cells vary due to random process and thermal variations, and wherein, due to placement of the switch interconnects within the first memory array, the average resistance is dependent on data values stored in the first memory cells and falls with a total resistance range having a minimum value that is above a low resistance state of a variable resistor of a nominal second memory cell and a maximum value that is below a high resistance state of the variable resistor of the nominal second memory cell such that the reference voltage is data-dependent.

20. The method of claim 18, wherein the first memory cells and the second memory cells comprise any of:

spin transfer torque-magnetic random access memory cells with magnetic tunnel junction-type variable resistors;

phase change memory cells with phase change material layer-type variable resistors; and resistive random access memory cells with memristor-type variable resistors, and wherein low and high resistance states of variable resistors in the first memory cells and the second memory cells vary due to random process and thermal variations, and wherein, due to placement of the switch interconnects within the first memory array, the average resistance is independent of data values stored in the first memory cells and has a fixed value at a midpoint between a low resistance state of a variable resistor of a nominal second memory cell and a high resistance state of the variable resistor of the nominal second memory cell such that the reference voltage is data-independent and constant.

* * * * *